(12) United States Patent
Tomita et al.

(10) Patent No.: US 7,655,886 B2
(45) Date of Patent: Feb. 2, 2010

(54) METHOD OF MEASURING A HEATING PLATE TEMPERATURE, SUBSTRATE PROCESSING DEVICE AND COMPUTER-READABLE RECORDING MEDIUM WITH COMPUTER PROGRAM RECORDED THEREON FOR MEASURING THE HEATING PLATE TEMPERATURE

(75) Inventors: Hiroshi Tomita, Koshi (JP); Ryuji Asai, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 553 days.

(21) Appl. No.: 11/632,965

(22) PCT Filed: Aug. 8, 2005

(86) PCT No.: PCT/JP2005/014510

§ 371 (c)(1),
(2), (4) Date: Jan. 19, 2007

(87) PCT Pub. No.: WO2006/016550

PCT Pub. Date: Feb. 16, 2006

(65) Prior Publication Data

US 2008/0142500 A1 Jun. 19, 2008

(30) Foreign Application Priority Data

Aug. 11, 2004 (JP) ............................. 2004-234765
Jul. 8, 2005 (JP) ............................. 2005-199673

(51) Int. Cl.
*H05B 1/02* (2006.01)
*H05B 3/68* (2006.01)

(52) U.S. Cl. .................................... 219/494; 219/444.1

(58) Field of Classification Search ... 219/443.1–468.2, 219/490–495; 118/724–729; 414/935–941
See application file for complete search history.

(56) References Cited

U.S. PATENT DOCUMENTS 5,651,823 A * 7/1997 Parodi et al. ................. 118/500

(Continued)

FOREIGN PATENT DOCUMENTS

DE 3515081 10/1986

(Continued)

OTHER PUBLICATIONS

Austrian Patent Office Search Report issued on Nov. 6, 2008.

*Primary Examiner*—Sang Y Paik
(74) *Attorney, Agent, or Firm*—Smith, Gambrell & Russell, LLP

(57) ABSTRACT

When a heating plate performs heat treatment on a substrate by a wireless wafer provided with a temperature detecting portion, a storing portion and a controller, the temperature of the heating plate is measured readily and accurately while suppressing lowering of a heating operation efficiency due to a measuring operation. A temperature measurement start instruction is provided to the controller of the wireless wafer at a position in a wireless wafer carrier, and thereby the wireless wafer starts temperature detection to store time-series data of the detected temperature value in the storing portion. The wireless wafer is transferred to a heating unit through a predetermined transfer path. Based on a transportation time required for placing the wireless wafer on the heating plate and the time-series data of the detected temperature value in the storing portion, the time-series data of the detected temperature value obtained after the wireless wafer is placed on the heating plate is fetched.

20 Claims, 19 Drawing Sheets

U.S. PATENT DOCUMENTS

| | | |
|---|---|---|
| 6,203,969 B1 | 3/2001 | Ueda |
| 6,515,731 B1 * | 2/2003 | Akimoto ..................... 355/27 |
| 6,624,393 B2 * | 9/2003 | Howell et al. ............ 219/444.1 |
| 6,814,507 B2 * | 11/2004 | Inagaki ....................... 396/571 |
| 7,297,906 B2 * | 11/2007 | Quach et al. ............. 219/444.1 |
| 2003/0101006 A1 | 5/2003 | Mansky et al. |

FOREIGN PATENT DOCUMENTS

| | | |
|---|---|---|
| JP | 09-189613 | 7/1997 |
| JP | 11-160160 | 6/1999 |
| JP | 11-307606 | 11/1999 |
| JP | 2000-091183 | 3/2000 |
| JP | 2001-102275 | 4/2001 |
| JP | 2002-124457 | 4/2002 |
| JP | 2003-077816 | 3/2003 |

* cited by examiner

|  | 1ST HEATING UNIT | 2ND HEATING UNIT | 3RD HEATING UNIT |
|---|---|---|---|
| TAKE-IN ANGLE OF WIRELESS WAFER Ww | 90° | 270° | 90° |
| 1ST TEMPERATURE SENSOR 70 | 2ND HEATER H11 | 1ST HEATER H20 | 1ST HEATER H31 |
| 2ND TEMPERATURE SENSOR 71 | 1ST HEATER H10 | 2ND HEATER H21 | 2ND HEATER H30 |

F I G. 2 1
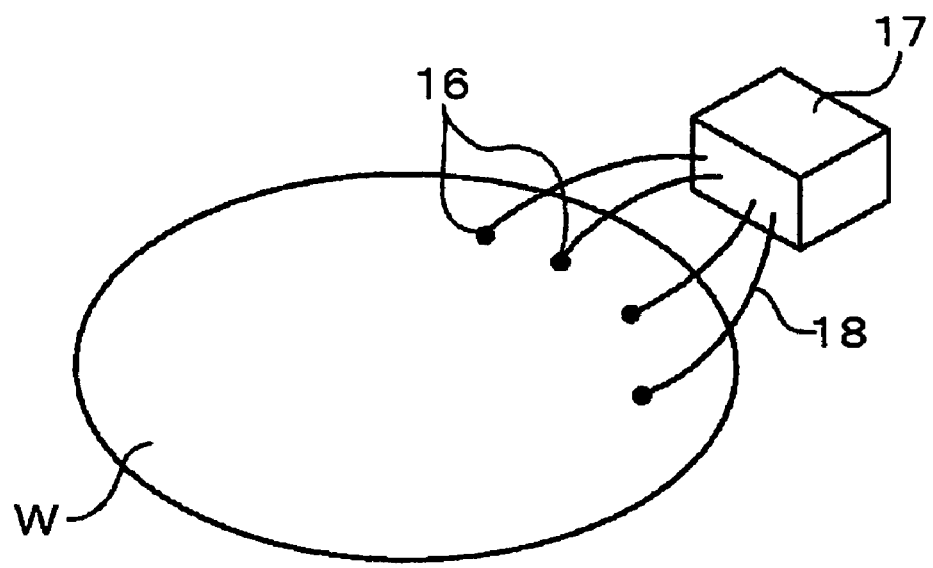

METHOD OF MEASURING A HEATING PLATE TEMPERATURE, SUBSTRATE PROCESSING DEVICE AND COMPUTER-READABLE RECORDING MEDIUM WITH COMPUTER PROGRAM RECORDED THEREON FOR MEASURING THE HEATING PLATE TEMPERATURE

TECHNICAL FIELD

The present invention relates to a substrate processing device in which a heating plate performs heat treatment on a surface of a substrate such as a semiconductor wafer, a photomask substrate or an LCD (Liquid Crystal Display) substrate (i.e., a glass substrate for an LCD), and particularly to a method of measuring a heating plate temperature, a substrate processing device and a computer-readable recording medium with a computer program recorded thereon for measuring the heating plate temperature.

BACKGROUND ART

In a manufacturing process for a semiconductor device and an LCD substrate, a resist pattern is formed on a substrate by a technique referred to as "photolithography". According to this technique, a series of processing is executed by applying a resist liquid over a substrate such as a semiconductor wafer (which will be referred to as a "wafer" hereinafter) to form a liquid film on a surface of the wafer, performing exposure on the resist film with a photomask and then performing developing processing to obtain a desired pattern.

The above processing of forming the resist pattern is performed by using a resist pattern forming device in which an exposing device is connected to an applying/developing device that generally performs resist liquid application and development.

FIG. 20 is a plan showing an example of a conventional resist pattern forming device.

Referring to FIG. 20, a conventional resist pattern forming device includes a carrier block 1A provided with a carrier stage 11 to and from which a carrier C accommodating twenty-five wafers W can be transferred, a processing block 1B, an interface block 1C and an exposing device 1D. Processing block 1B is provided at its central position with a transporting portion 12, and is also provided around transporting portion 12 with an application unit 13A for applying a resist liquid to the wafer, a liquid processing unit group including a plurality of developing units 13B and the like that are arranged in multiple levels for performing developing processing on the wafer subjected to the exposure, a heating unit for performing predetermined heat treatment on the wafer before and after the processing performed by the application unit and the developing unit, and shelf units 14 (14A-14C) provided with transferring units and the like. Carrier block 1A includes a transfer arm 15 that transfers a wafer W between carrier C and processing block 1B.

The heating unit is internally provided with a heating portion, and can perform predetermined heat treatment on wafer W by placing wafer W on a heating plate kept at a predetermined temperature. The heating unit performs several kinds of processing such as a pre-bake processing for evaporating a thinner in resist components, a post-exposure baking processing for relieving a fringe of a resist pattern, and a post-baking processing of removing a rinse liquid remaining after development by evaporating it or hardening the resist. The resist pattern forming device is provided with a plurality of heating units performing various kinds of processing.

The heating unit may have a heating plate divided into a plurality of heating zones that are independently heated by a plurality of concentric heaters, respectively. In this case, it is necessary to uniformize temperature rising patterns of the respective heating zones for ensuring in-plane uniformity in film thickness and developing line width. Also, it is necessary to uniformize the temperature rising patterns of the heating plates performing the same processing for ensuring the uniformity in film thickness and developing line width of the heating units. Therefore, at the time of startup of the device or periodically, processing is performed to determine temperature characteristics of the heating plates of the heating units and uniformize the temperature rising patterns of the heating zones, and the heating portions in the heating units performing the same processing are controlled to ensure the same temperature rising pattern.

FIG. 21 is a perspective view showing a wafer for temperature measurement of the heating plate.

Conventionally, the temperature characteristics of the heating plate are measured by such an operation that wafer W provided at its surface with forty temperature sensors is placed on the heating plate, and the temperature is measured at intervals of a predetermined time. In this case, as illustrated in FIG. 21, temperature sensors 16 must be connected by serial cables 18 to a measuring device 17 that is arranged outside wafer W for storing temperature data provided from each temperature sensor 16.

For measuring the temperature characteristics of the heating plate, it is necessary to remove a rear cover of the resist pattern forming device, to place wafer W bearing temperature sensors 16 on the heating plate and to connect temperature sensors 16 to measuring device 17 arranged outside wafer W by serial cables 18. As described above, the read cover of the device must be opened every time the temperature characteristics of the heating plate are to be measured, which results in an inconvenient handling. When heat is discharged due to opening of the cover, a wait time will be required until the temperature inside the heating unit becomes stable after closing the cover. In the conventional resist pattern forming device, the above operation is required for each heating unit so that the sum of the above wait times may exceed 20 hours.

In view of the above, the inventors are making a study for temperature measurement with a wireless wafer that does not require serial cables extending externally from wafer W. This wireless wafer is provided at itself with a temperature sensor, a battery, a memory and a controller, and is configured to save temperature data in the memory at intervals, e.g., of one second. A technique in Japanese Patent Laying-Open No. 11-307606 (Patent Document 1) has been known as a manner of evaluating uniformity in substrate temperature during heat treatment with the above type of wafer.

Patent Document 1: Japanese Patent Laying-Open No. 11-307606

DISCLOSURE OF THE INVENTION

Problems to be Solved by the Invention

The use of the wireless wafer brings about a merit that a transporting portion can transfer it to the heating unit similarly to ordinary wafer W. However, the wireless wafer does not recognize timing according to which the wireless wafer is transferred into and from the heating unit, and does not identify the specific heating unit for such transference. Therefore, it is impossible to determine the timing according to which the wireless wafer is placed on the heating plate, and the temperature data based on accurate timing cannot be obtained without difficulty.

Accordingly, the inventors determine the timing of placement of the wireless wafer on the heating plate from the temperature data, and the point at which the temperature rises 10° C. or more during five minutes is recognized as the timing of placement of the wireless wafer on the heating plate.

FIG. 22A is a characteristic diagram illustrating an example of a temperature rising pattern of the heating plate. FIG. 22B illustrates on an enlarged scale a portion indicated by B in FIG. 22A.

Referring to these figures, the temperature slowly rises at the start of heating so that it is difficult to recognize a point where the temperature rises, e.g., 10° C. during five seconds.

When it is impossible to determine the temperature data according to the accurate timing of placement of the wireless wafer on the heating plate, an error occurs in the temperature rising pattern of the heating plate. For example, in the case where a plurality of heaters heats the heating plate, it is difficult to determine the accurate temperature rising pattern of each heating zone, and control is difficult to perform the heat processing with high in-plane uniformity by uniformizing the temperature rising patterns in the respective zones. Particularly, in an initial stage of the temperature rising, the temperature rapidly rises after slow rising of the temperature. Therefore, when an error of one second occurs in the determined timing, large variations occur in temperature rising pattern.

When differences occur in the temperature rising pattern between the heating units, it becomes difficult to perform the heat treatment with high uniformity kept among the heating units. Japanese Patent Laying-Open No. 11-307606 (Patent Document 1) has not discussed the manner of recognizing the timing of placement of the wireless wafer on the heating plate, and therefore the manner in Japanese Patent Laying-Open No. 11-307606 cannot be used for measuring the heating plate temperature.

The invention has been made under the above circumstance, and an object of the invention is to provide a heating plate temperature measuring method that allows easy and accurate measurement of a temperature of a heating plate thermally processing a substrate while suppressing lowering of an operation efficiency due to a measuring operation as well as a substrate processing device and a computer-readable recording medium with a computer program recorded thereon for measuring the heating plate temperature.

Means for Solving the Problems

For achieving the above object, a heating plate temperature measuring according to an aspect of the invention is a method of measuring a heating plate temperature in a substrate processing device provided with a carrier take-in portion taking in a carrier accommodating a plurality of substrates, a processing unit including a heating unit placing the substrate on the heating plate and performing heat treatment on the substrate, and a transporting portion receiving the substrate from the carrier take-in portion and transporting the substrate to the processing unit, and the method includes a step of transporting the temperature detection substrate including a temperature detecting portion, a storing portion and a substrate controller through a predetermined transportation path to the heating unit by the transporting portion; a start instruction providing step of providing a temperature measurement start instruction to the substrate controller of the temperature detection substrate in a predetermined position on the transportation path; a step of receiving the temperature measurement start instruction and storing time-series data of a detected temperature value in the storing portion by the temperature detection substrate; and a time-series data fetching step of fetching the time-series data of the detected temperature value obtained after placement of the temperature detection substrate on the heating plate based on a transportation time from the provision of the temperature measurement start instruction to the placement of the temperature detection substrate on the heating plate and the time-series data of the detected temperature value in the storing portion.

Preferably, an adjustment computer takes out the time-series data of the detected temperature value after the placement of the temperature detection substrate on the heating plate in the time-series data fetching step.

Further preferably, the method of measuring the heating plate temperature further includes a step of correcting a control parameter of a heating portion included in the heating plate based on the time-series data of the detected temperature value obtained after the placement of the temperature detection substrate on the heating plate.

Further preferably, the heating plate is divided into a plurality of heating regions, and is configured to heat independently each of the divided regions by corresponding one among a plurality of heating portions, and the temperature detecting portion included in the temperature detection substrate is arranged in each of positions corresponding to the respective divided portions.

Further preferably, the heating plate is circumferentially divided into a plurality of heating regions, and is configured to heat independently each of the divided regions by corresponding one among a plurality of heating portions, the temperature detection substrate includes a plurality of the temperature detecting portions for detecting the temperature of each of the divided regions, and the method of measuring the heating plate temperature further includes a step of correcting a control parameter of each of the heating portions based on the time-series data of the detected temperature value of each of the divided regions obtained according to a direction of the temperature detection substrate at the time of placement of the temperature detection substrate on the heating plate and the time-series data of the detected temperature value of each of the temperature detecting portions.

Further preferably, in the start instruction providing step, a carrier controller arranged at the carrier accommodating the temperature detection substrate and placed on the carrier take-in portion provides the temperature measurement start instruction, and the temperature measurement start instruction is output when the transporting portion takes out the temperature detection substrate from the carrier.

Preferably, the method of measuring the heating plate temperature further includes a step of correcting a control parameter of a heating portion included in the heating plate based on the time-series data of the detected temperature value obtained after the placement of the temperature detection substrate on the heating plate.

Preferably, the heating plate is divided into a plurality of heating regions, and is configured to heat independently each of the divided regions by corresponding one among a plurality of heating portions, and the temperature detecting portion included in the temperature detection substrate is arranged in each of positions corresponding to the respective divided portions.

Preferably, the heating plate is circumferentially divided into a plurality of heating regions, and is configured to heat independently each of the divided regions by corresponding one among a plurality of heating portions, the temperature detection substrate includes a plurality of the temperature detecting portions for detecting the temperature of each of the divided regions, and the method of measuring the heating plate temperature further includes a step of correcting a control parameter of each of the heating portions based on the time-series data of the detected temperature value of each of the divided regions obtained according to a direction of the temperature detection substrate at the time of placement of the temperature detection substrate on the heating plate and the time-series data of the detected temperature value of each of the temperature detecting portions.

Preferably, in the start instruction providing step, a carrier controller arranged at the carrier accommodating the temperature detection substrate and placed on the carrier take-in portion provides the temperature measurement start instruction, and the temperature measurement start instruction is output when the transporting portion takes out the temperature detection substrate from the carrier.

For achieving the above object, a substrate processing device according to an aspect of the invention includes a carrier take-in portion taking in a carrier accommodating a plurality of substrates; a processing unit including a heating unit placing the substrate on the heating plate and performing heat treatment on the substrate; a transporting portion receiving the substrate from the carrier take-in portion and transporting the substrate to the processing unit; a control portion controlling the transporting portion to transport the temperature detection substrate including a temperature detecting portion, a storing portion and a substrate controller through a predetermined transportation path to the heating unit by the transporting portion; a carrier controller providing a temperature measurement start instruction to the substrate controller of the temperature detection substrate in a predetermined position on the transportation path; and an adjustment computer of fetching time-series data of a detected temperature value obtained after placement of the temperature detection substrate on the heating plate based on a transportation time from the provision of the temperature measurement start instruction to the placement of the temperature detection substrate on the heating plate and the time-series data of the detected temperature value that is stored in the storing portion included in the temperature detection substrate in response to reception of the temperature measurement start instruction.

Preferably, the control portion further corrects a control parameter of a heating portion included in the heating plate based on the time-series data of the detected temperature value obtained after the placement of the temperature detection substrate on the heating plate.

Further preferably, the heating plate is divided into a plurality of heating regions, and is configured to heat independently each of the divided regions by a plurality of heating portions, and the temperature detecting portion included in the temperature detection substrate is arranged in each of positions corresponding to the respective divided portions.

Further preferably, the heating plate is circumferentially divided into a plurality of heating regions, and is configured to heat independently each of the divided regions by a plurality of heating portions, the temperature detection substrate includes a plurality of the temperature detecting portions for detecting the temperature of each of the divided regions, and the control portion further corrects a control parameter of each of the heating portions based on the time-series data of the detected temperature value of each of the divided regions obtained according to a direction of the temperature detection substrate at the time of placement of the temperature detection substrate on the heating plate and the time-series data of the detected temperature value of each of the temperature detecting portions.

Further preferably, the carrier controller is arranged at the carrier accommodating the temperature detection substrate and placed on the carrier take-in portion, and provides the temperature measurement start instruction when the transporting portion takes out the temperature detection substrate from the carrier.

Preferably, the heating plate is divided into a plurality of heating regions, and is configured to heat independently each of the divided regions by a plurality of heating portions, and the temperature detecting portion included in the temperature detection substrate is arranged in each of positions corresponding to the respective divided portions.

Preferably, the heating plate is circumferentially divided into a plurality of heating regions, and is configured to heat independently each of the divided regions by a plurality of heating portions, the temperature detection substrate includes a plurality of the temperature detecting portions for detecting the temperature of each of the divided regions, and the control portion further corrects a control parameter of each of the heating portions based on the time-series data of the detected temperature value of each of the divided regions obtained according to a direction of the temperature detection substrate at the time of placement of the temperature detection substrate on the heating plate and the time-series data of the detected temperature value of each of the temperature detecting portions.

Preferably, the carrier controller is arranged at the carrier accommodating the temperature detection substrate and placed on the carrier take-in portion, and provides the temperature measurement start instruction when the transporting portion takes out the temperature detection substrate from the carrier.

For achieving the above object, according to an aspect of the invention, a computer-readable recording medium with a computer program recorder thereon and used for measuring a heating plate temperature in a substrate processing device provided with a carrier take-in portion taking in a carrier accommodating a plurality of substrates, a processing unit including a heating unit placing the substrate on the heating plate and performing heat treatment on the substrate, and a transporting portion receiving the substrate from the carrier take-in portion and transporting the substrate to the processing unit, and the program causes a computer to execute a step of transporting the temperature detection substrate including a temperature detecting portion, a storing portion and a substrate controller through a predetermined transportation path to the heating unit by the transporting portion; a start instruction providing step of providing a temperature measurement start instruction to the substrate controller of the temperature detection substrate in a predetermined position on the transportation path; a step of receiving the temperature measurement start instruction and storing time-series data of a detected temperature value in the storing portion by the temperature detection substrate; and a time-series data fetching step of fetching the time-series data of the detected temperature value obtained after placement of the temperature detection substrate on the heating plate based on a transportation time from the provision of the temperature measurement start instruction to the placement of the temperature detection substrate on the heating plate and the time-series data of the detected temperature value in the storing portion.

Preferably, an adjustment computer takes out the time-series data of the detected temperature value after the placement of the temperature detection substrate on the heating plate in the time-series data fetching step.

Effects of the Invention

According to the invention, since the temperature of the heating plate is measured using the temperature detection substrate provided with the temperature detecting portion, the storing portion and the controller, the temperature of the heating plate can be measured readily and accurately. In the operation of measuring the heating plate temperature, since the time-series data of the detected temperature value obtained after placement of the temperature detection substrate on the heating plate is fetched based on the transportation time from the provision or output of the temperature measurement start instruction to the placement of the temperature detection substrate on the heating plate and the time-series data of the detected temperature value in the storing portion, the timing of transportation of the temperature detection substrate to the heating plate can be accurately determined, the time-series data of the detected temperature value can be accurately fetched and the accurate temperature measurement can be performed.

BRIEF DESCRIPTION OF THE DRAWINGS

FIG. 21 is a perspective view showing a wafer for measuring a heating plate temperature.

DESCRIPTION OF THE REFERENCE SIGNS

W semiconductor wafer (substrate), Ww wireless wafer (substrate), C carrier, Cw carrier (wireless wafer carrier), B1 carrier take-in portion, B2 processing block, B3 interface portion, B4 exposing device, A1 transfer arm (first transporting portion), A2 and A3 main transporting mechanism (first transporting portion), A4 main transporting portion (second transporting portion), A5 auxiliary transporting portion (second transporting portion), 34 heating plate, 33 cooling plate, 41 temperature detecting portion, 42 controller of wireless wafer Ww, 45 controller of wireless wafer carrier Cw, 5 adjustment computer, 502 temperature data obtaining portion, 503 summary data calculating portion, 504 offset calculating portion, 6 and 9 control portion, 604 control parameter correcting portion, H1, H2 and H3 heater (heating portion), U1, U2 and U3 processing unit, 100 resist pattern forming device (substrate processing device).

BEST MODES FOR CARRYING OUT THE INVENTION

Embodiments of the invention will now be described with reference to the drawings. In the figures, the same or corresponding portions bear the same reference numbers, and description thereof is not repeated.

FIRST EMBODIMENT

Figure 1:
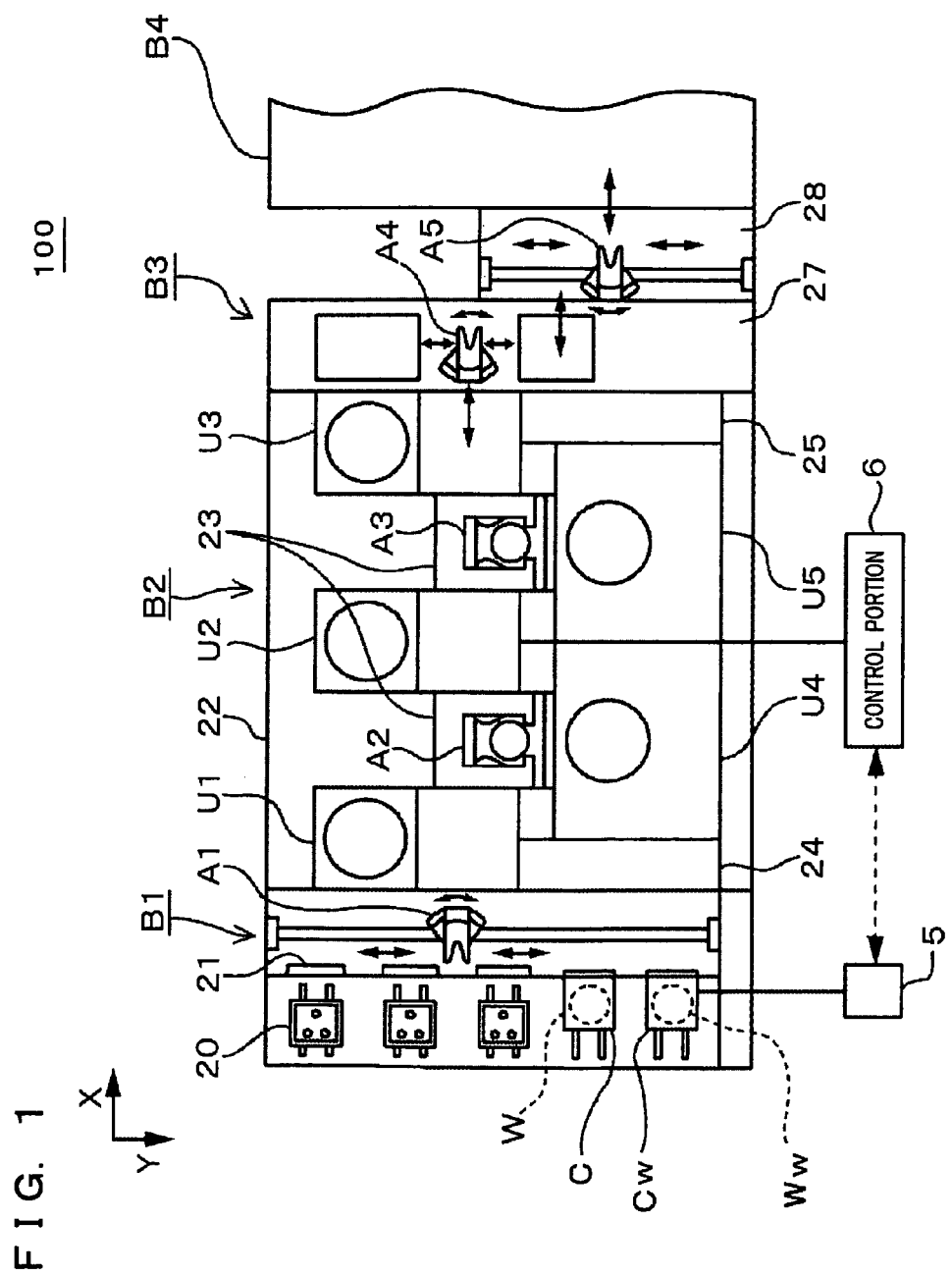
FIG. 1 is a plan of a substrate processing device (resist pattern forming device) 100 according to a first embodiment of the invention.

FIG. 1 is a plan of a substrate processing device (resist pattern forming device) 100 according to a first embodiment of the invention.

Figure 2:
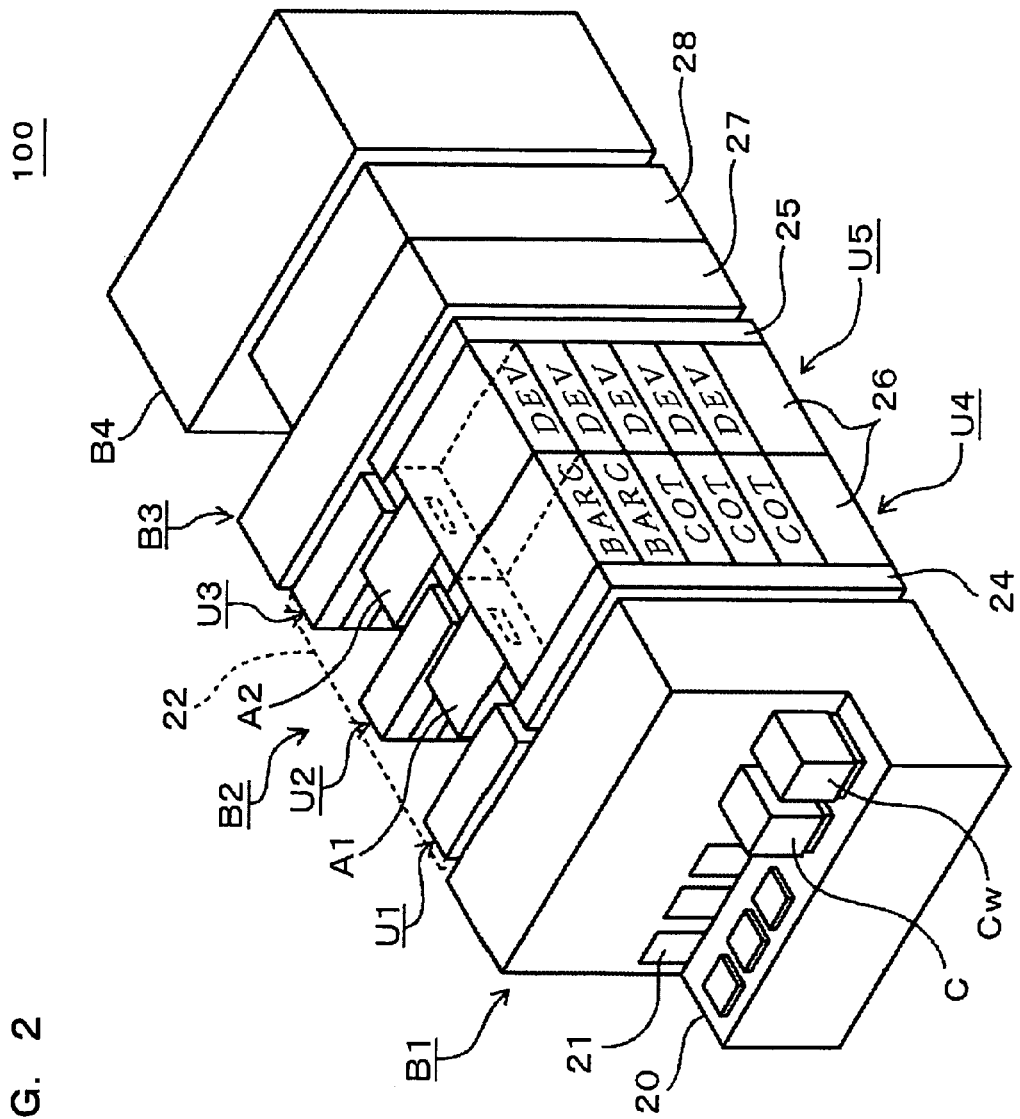
FIG. 2 is a schematic perspective view of substrate processing device (resist pattern forming device) 100 according to the first embodiment of the invention.

FIG. 2 is a schematic perspective view of substrate processing device (resist pattern forming device) 100 according to the first embodiment of the invention.

Substrate processing device 100 includes an applying/developing device and an exposing device connected thereto. A carrier take-in portion B1 takes in/out carrier C that airtightly accommodates, e.g., thirteen wafers W that are substrates, and also takes in/out a wireless wafer carrier Cw accommodating a wafer Ww. Carrier take-in portion B1 includes carrier platforms 20 on which a plurality of carriers C and a plurality of wireless wafer carriers Cw can be placed, an opening/closing portion 21 arranged at a wall in a forward position with respect to carrier platforms 20, and a transfer arm A1 for taking out wafer W from carrier C through opening/closing portion 21 and taking out wireless wafer Ww from wireless wafer carrier Cw.

A deep or inner side of carrier take-in portion B1 is connected to a processing portion B2 having a periphery surrounded by a casing 22. In processing portion B2, three shelf units U1, U2 and U3 each having heating and cooling units at multiple levels in a stacked fashion are arranged in this order from the inlet side to the deeper side, and main transporting mechanisms A2 and A3 for transferring wafers W to or from other processing units are also arranged alternately to shelf units U1, U2 and U3. Shelf units U1, U2 and U3 as well as main transporting mechanisms A2 and A3 are arranged in one row extending in a forward/backward direction viewed from the side of carrier take-in portion B1, and each of connection portions between these units and mechanisms is provided with an opening (not shown) for wafer transportation so that wafer W can freely move in processing portion B2 from shelf unit U1 on one end thereof to shelf unit U3 on the other end.

Main transporting mechanisms A2 and A3 are located in respective spaces each surrounded by a partition 23 which is formed of one plane portion on the shelf unit (U1, U2 and U3) side arranged in the forward/backward direction when viewed from carrier take-in portion B1, one plane portion on the right side, i.e., liquid processing unit (U4 and U5) side and a rear plane portion forming a plane on the left side.

Main transporting mechanisms A2 and A3 are movable in forward and backward directions as well as in a vertical direction, are rotatable around respective vertical axes and can transport wafers W between units, i.e., shelf units U1, U2 and U3 as well as liquid processing units U4 and U5. The controller controls the driving of main transporting mechanisms A2 and A3 based on an instruction provided from a control portion 6 which will be described later. Temperature and humidity adjusting units 24 and 25 are provided with temperature adjusting devices for processing liquid used in the processing units as well as ducts for adjusting the temperature and humidity, and others.

Each of liquid processing units U4 and U5 has a structure in which, for example, application units (BARC) for an anti-reflection film, application units (COT) for resist and developing units (DEV) are stacked in multiple (e.g., five) levels and are arranged above an accommodating portion 26 forming a space for supplying chemical solutions such as a chemical solution for anti-reflection film, a resist liquid and a developer liquid. For the sake of simplicity, the application unit for the anti-reflection film and the application unit for the resist are referred to as an "anti-reflection film unit" and an "application unit" hereinafter, respectively.

Figure 3:
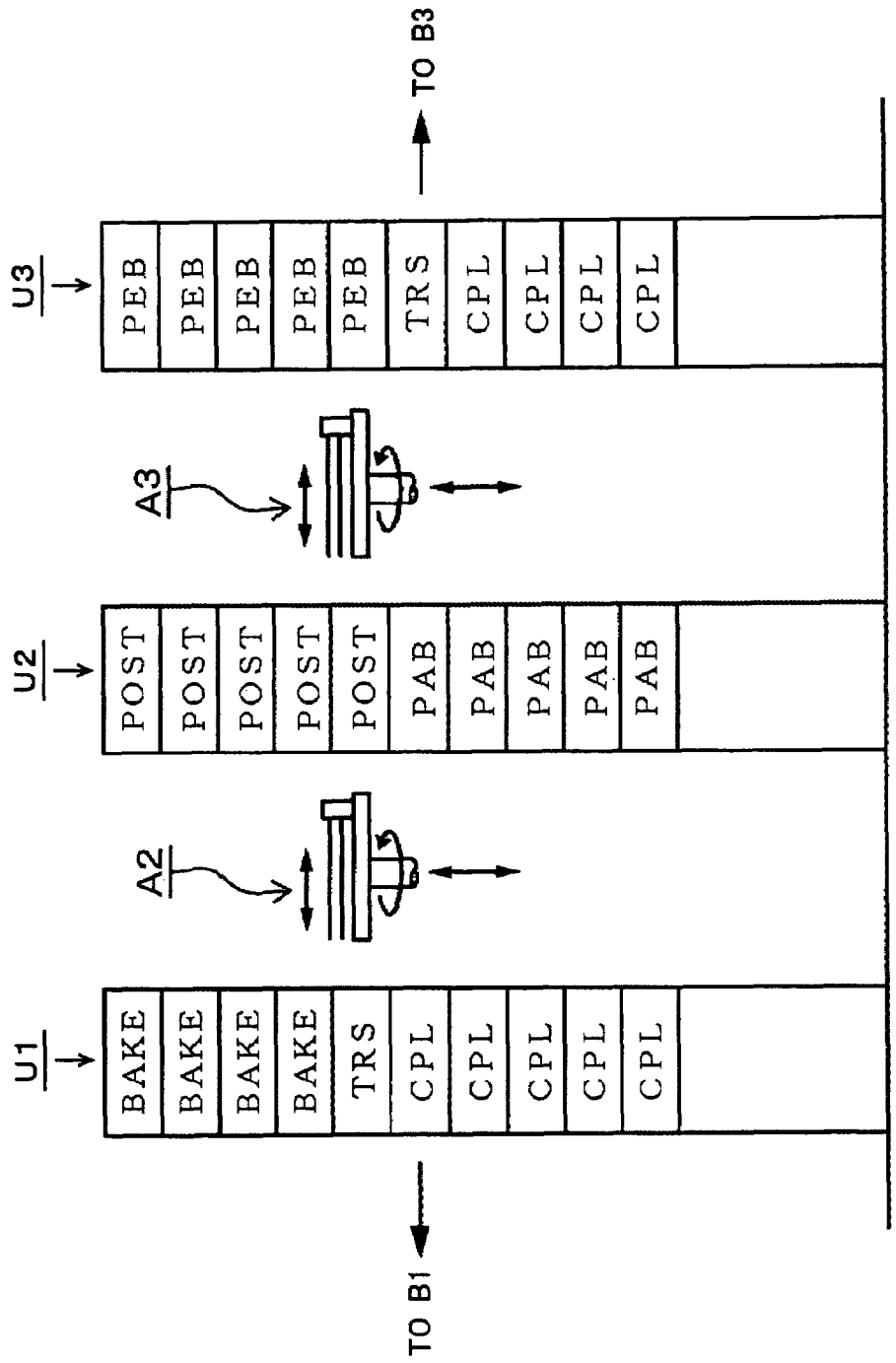
FIG. 3 is a side view showing a shelf unit in substrate processing device 100.

FIG. 3 is a side view illustrating the shelf units in substrate processing device 100.

Referring to FIG. 3, each of shelf units U1, U2 and U3 includes various processing units stacked in multiple levels for performing pretreatment and post treatment for the processing performed in liquid processing units U4 and U5. These various processing units for performing the above pretreatment and post treatment includes, i.e., a transfer unit (TRS), a temperature control unit (CPL) for keeping wafer W at a predetermined temperature, a heating unit (BAKE) for performing heat treatment on wafer W before application of the resist liquid, a heating unit (PAB) which is employed for performing heat treatment on wafer W after application of the resist liquid and is referred to as a "pre-baking unit", a heating unit (PEB) which is employed for heating wafer W subjected to the exposure and is referred to as a "post-exposure baking unit", and a heating unit (POST) which is employed for heating wafer W after the developing processing and is referred to as a "post-baking unit". FIG. 3 merely shows an example of a layout of these units for the sake of convenience. In the actual devices, the numbers of the respective kinds of units are determined in view of processing times and the like of the respective units.

An exposing device B4 is connected via an interface portion B3 to the deeper side of shelf unit U3 in processing block B2. Interface portion B3 is formed of first and second transportation chambers 27 and 28 which are arranged in forward and rearward positions between processing portion B2 and exposing device B4, respectively, and are provided with main and auxiliary transporting portions A4 and A5, respectively.

In substrate processing device 100, the heating unit, transfer unit, temperature adjusting unit, application unit, anti-reflection film forming unit and developing unit correspond to the processing units, respectively. Transfer arm A1 and main transporting mechanisms A2 and A3 correspond to the first transporting portion in the embodiment of the invention. Thus, the first transporting portion receives wafer W and wireless wafer Ww from carrier take-in portion B1, and transports it to the processing units.

For forming a resist pattern over product wafer W by substrate processing device 100, wafer W is transported, e.g., through the following path. Wafer W that is arranged in carrier C placed on carrier take-in portion B1 and is not yet processed is transported by transfer arm A1 to transfer unit (TRS), and then is transported by main transporting mechanisms A2 and A3 through the temperature control unit (CPL), anti-reflection film forming unit (BARC), heating unit (BAKE) and temperature control unit (CPL) to application unit (COT) in this order. The application unit (COT) applies the resist liquid to wafer W. Then, wafer W is sent to exposing device B4 through the heating unit (PAB), temperature control unit (CPL), transfer unit (TRS) and interface portion B3, and is subjected to the predetermined exposing processing.

Wafer W subjected to the exposing processing returns to processing portion B2 through a reverse path. More specifically, wafer W subjected to the exposing processing is transported through the heating unit (PEB) and temperature control unit (CPL) to the developing unit (DEV), which performs the developing processing on wafer W, and then is transported through the heating unit (POST), temperature control unit (CPL) and transfer unit (TRS) of shelf unit U1 in this order. Then, transfer arm A1 returns wafer W to carrier C of carrier take-in portion B1.

Figure 4A:
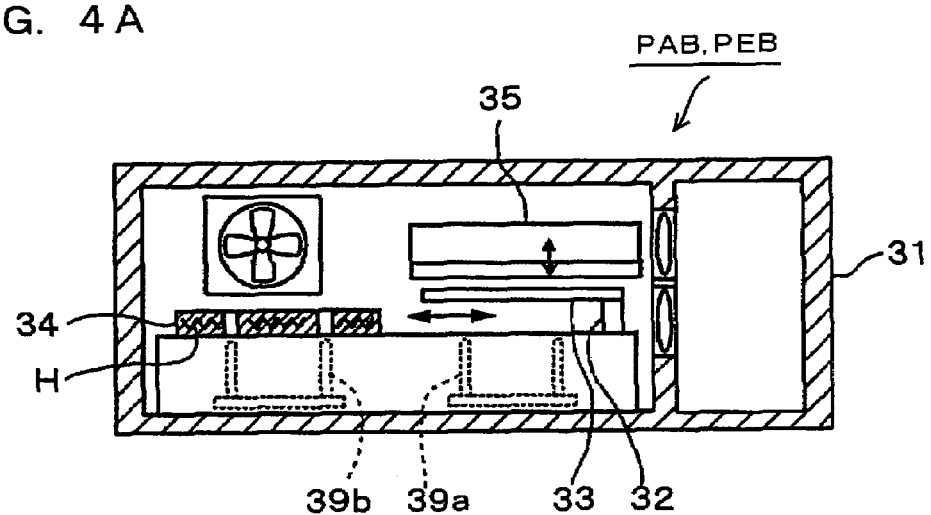
FIG. 4A is a cross section of a heating unit in substrate processing device 100.
Figure 4B:
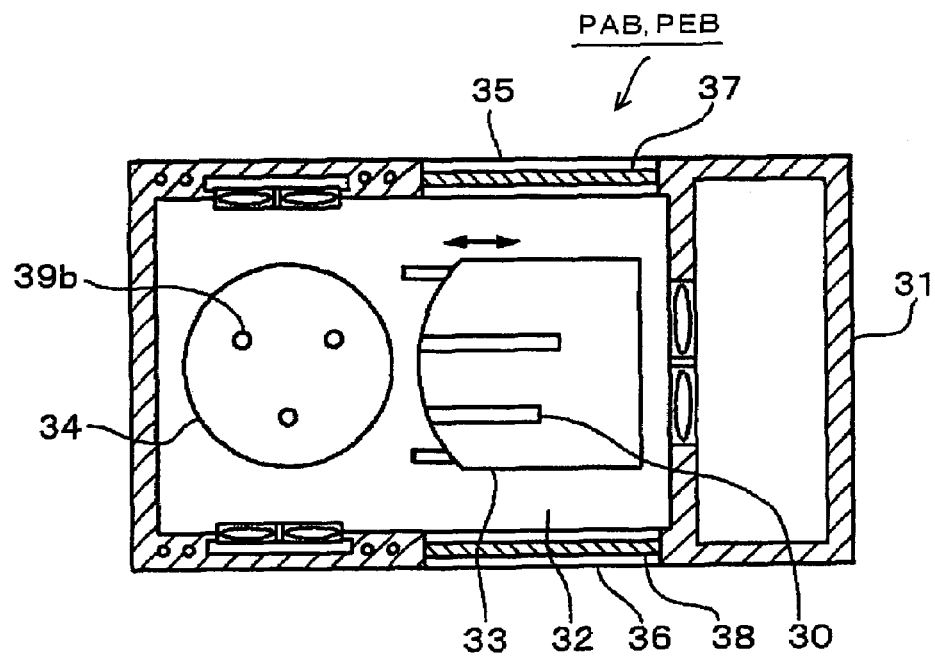
FIG. 4B is a cross section of the heating unit in substrate processing device 100.

Description will now be briefly given, by way of example, on a structure of the heating unit performing the PAB processing and PEB processing. FIGS. 4A and 4B are cross sections showing the heating unit in substrate processing device 100.

Referring to FIGS. 4A and 4B, the heating unit includes a casing 31, a stage 32, a cooling plate 33 which is movable laterally in the figures above the stage and is provided with slits 30, inlet/outlet portions 35 and 36 for wafer W, shutters 37 and 38 that can close inlet/outlet portions 35 and 36, respectively, and elevator pins 39a or 39b forming sets each formed of three pins.

For heating unit (PAB) arranged in shelf unit U2, main transporting mechanisms A2 and A3 can access the inside of casing 31. For heating unit (PEB) arranged in shelf unit U3, main transporting mechanisms A3 and A4 can access the inside of casing 31.

More specifically, when main transporting mechanism A2 (or main transporting portion A4) enters into heating unit (PAB or PEB) via inlet/outlet portion 35 (or 36), elevator pins 39a transfer wafer W on main transporting mechanism A2 (main transporting portion A4) onto cooling plate 33. By moving cooling plate 33 and vertically moving elevator pins 39b, wafer W is transferred from cooling plate 33 to a heating plate 34. Wafer W subjected to the heat treatment by heating plate 34 is returned from heating plate 34 onto cooling plate 33 for rough cooling. After the cooling, main transporting mechanism A3 receives wafer W, and transports it to a next stage.

Figure 5:
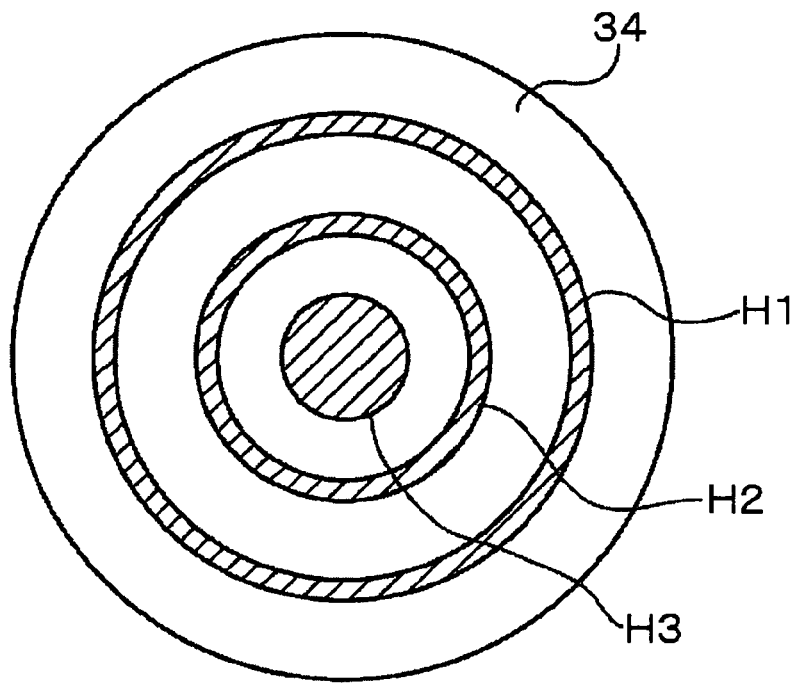
FIG. 5 is a plan of a heating plate 34.

FIG. 5 is a plan of heating plate 34.

Referring to FIG. 5, heating plate 34 internally has a heating portion for heating heating plate 34 to a predetermined temperature. The heating portion is formed of, e.g., three concentric (annular) heaters H (H1-H3) formed of resistance heating wires. Thereby, heating plate 34 can operate to heat radially divided three heating regions or zones by respective heaters H (H1-H3), and the temperature of each zone is independently controlled.

Among the heating units, the heating unit performing the bake processing or post-baking processing (POST) has heating plate 34 performing the heat treatment at a predetermined temperature on wafer W placed thereon, although not shown. Further, temperature control unit (CPL) has a temperature control plate performing the temperature adjusting processing at a predetermined temperature on the wafer that is placed thereon and is already subjected to the heat treatment.

Figure 6:
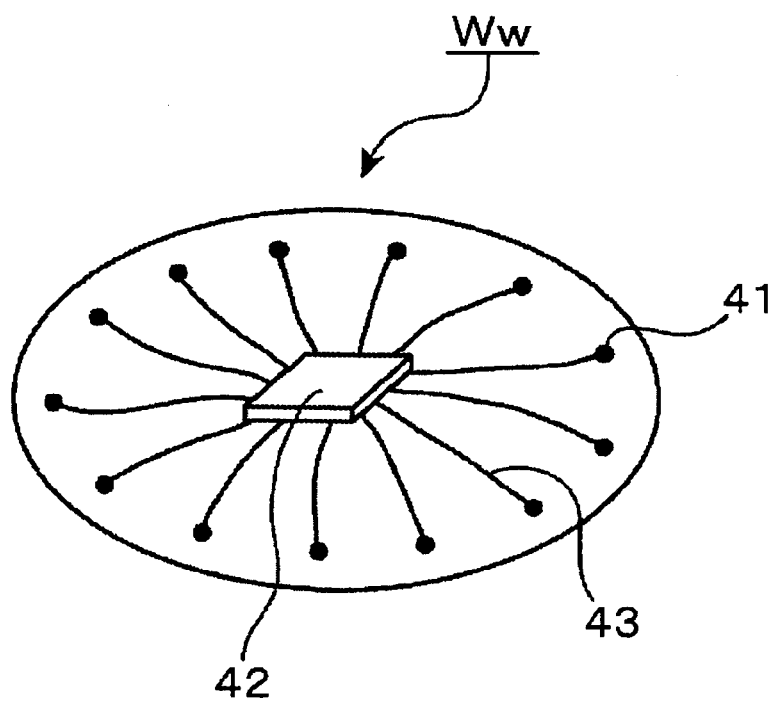
FIG. 6 is a perspective view of a wireless wafer Ww.

FIG. 6 is a perspective view of wireless wafer Ww.

Referring to FIG. 6, wireless wafer Ww is provided at itself with a temperature sensors 41 each forming a temperature detecting portion, and a controller (substrate controller) 42 internally provided with a battery and a storing portion. Each temperature sensor 41 is connected to controller 42, e.g., by a cable 43. Temperature sensors 41 are located, e.g., in positions corresponding to the three heating zones in heating plate 34, respectively.

For example, as will be described later, wireless wafer Ww is configured such that temperature sensor 41 can detect the temperature data at predetermined intervals, e.g., of one second in response to the provision of the temperature detection start instruction to controller 42, and the time-series data of the detected temperature value thus obtained can be stored in the storing portion.

Figure 7:
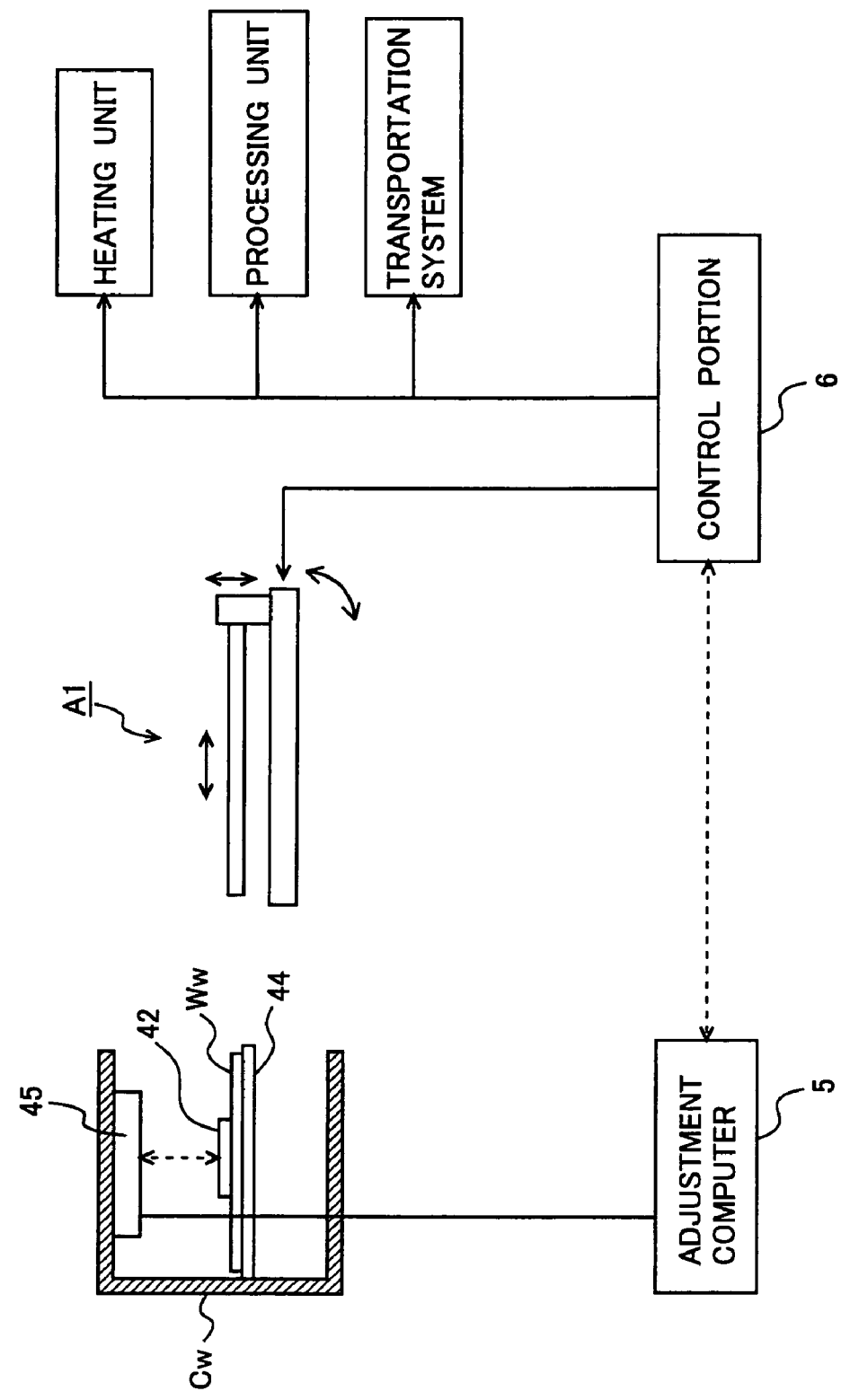
FIG. 7 shows sections of a wireless wafer carrier Cw and others.

FIG. 7 shows cross sections of wireless wafer carrier Cw and others.

Referring to FIG. 7, wireless wafer carrier Cw includes a controller (carrier controller) 45 that performs wireless communications with controller 42 of wireless wafer Ww, provides a measurement start instruction to temperature detecting portion 41 and reads the time-series data of the detected temperature value stored in the storing portion of controller 42. Wireless wafer carrier Cw also includes a holding portion 44 for holding wireless wafer Ww. Controller 45 is configured to transmit by radio or cable the data to and from an adjustment computer 5 arranged outside wireless wafer carrier Cw.

Figure 8:
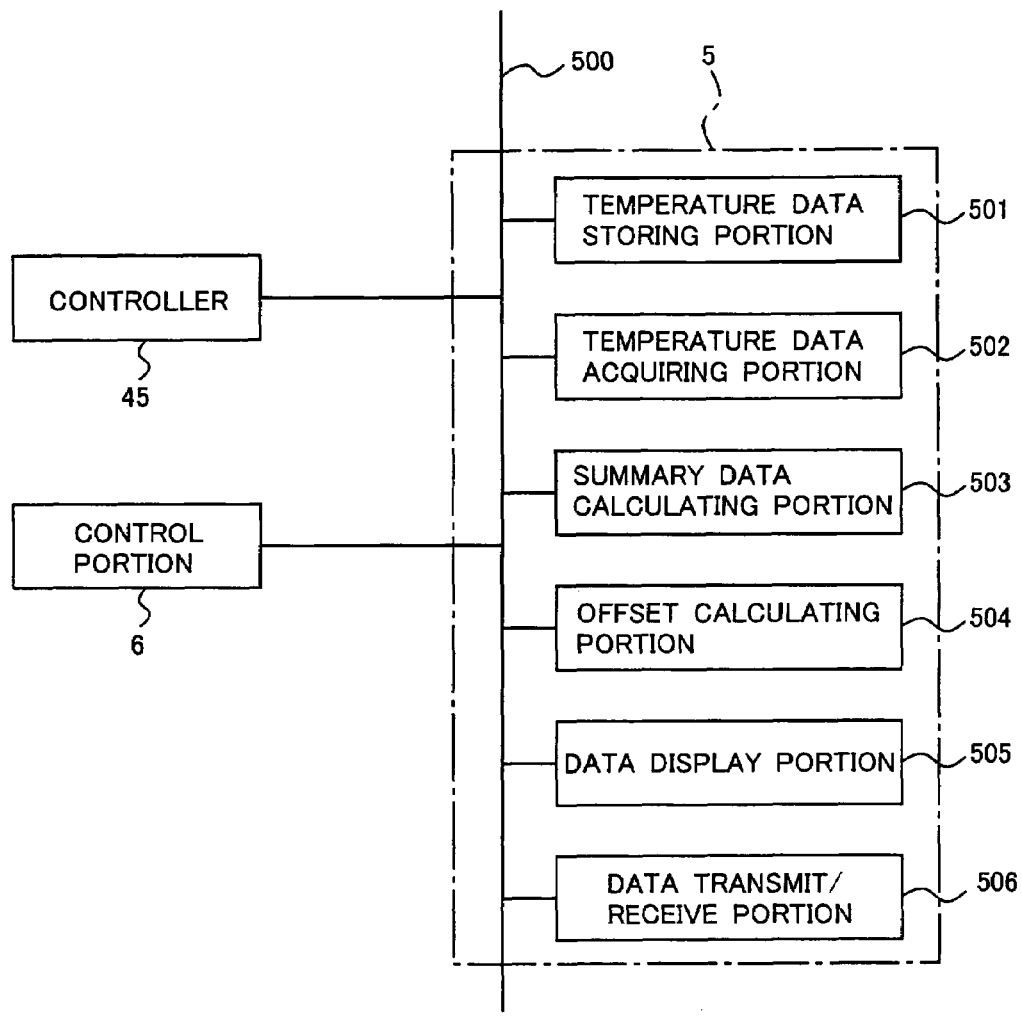
FIG. 8 shows a structure of an adjustment computer 5.

FIG. 8 shows a structure of adjustment computer 5. In practice, adjustment computer 5 is formed of a CPU (Central Processing Unit), a program, a memory and the like, but some of such components take block forms in the following description.

Referring to FIG. 8, adjustment computer 5 includes a bus 500, a temperature data storing portion 501, a temperature data obtaining portion 502, a summary data calculating portion 503, an offset calculating portion 504, a data display portion 505 and a data transmit/receive portion 506, which are connected to bus 500.

Temperature data storing portion 501 stores the time-series data of the detected temperature value that is measured by wireless wafer Ww and is transmitted via controller 45. Temperature data obtaining portion 502 takes out the time-series data (which will be referred to as "temperature data of the heating plate" hereinafter) of the detected temperature value obtained in connection with each heating unit after the placement of wireless wafer Ww on heating plate 34 according to the time-series data of the detected temperature value measured by wireless wafer Ww and transportation history of wireless wafer Ww managed by control portion 6 to be described later. Summary data calculating portion 503 calculates, based on the temperature data of heating plate 34, summary data that is temperature information of heating plate 34 and, for example, includes an average value of the in-plane temperature of heating plate 34 within a predetermined time band (which will be simply referred to as an "average value" hereinafter) and an in-plane temperature difference of heating plate 34 such as temperature differences (which will be referred to as a "range" hereinafter) between the zones heated by respective heaters H1-H3.

Offset calculating portion 504 calculates an offset value based on a result of a comparison of the average value and range of the in-plane temperature of the heating plate with a target temperature range and a target in-phase temperature difference. The offset value is obtained by performing a combination of the temperature target values such that the average value and range of the in-plane temperature of the heating plate obtained based on the detected temperature values of the respective zones may fall within the target temperature range and the target in-plane temperature difference.

Data display portion 505 displays, e.g., on an operation screen of adjustment computer 5 the obtained temperature data, summary data and offset value of heating plate 34. Data transmit/receive portion 506 performs transmission/reception of predetermined data to/from control portion 6 to be described below.

Substrate processing device 100 includes control portion 6 that controls at least various processing units such as the heating units (BAKE, PAB, PEB and POST), application unit (COT), developing unit (DEV) and temperature control unit (CPL) as well as transportation system and the like including transfer arm A1, main transporting mechanisms A2 and A3, the second transporting portions (A4 and A5) and the like.

Figure 9:
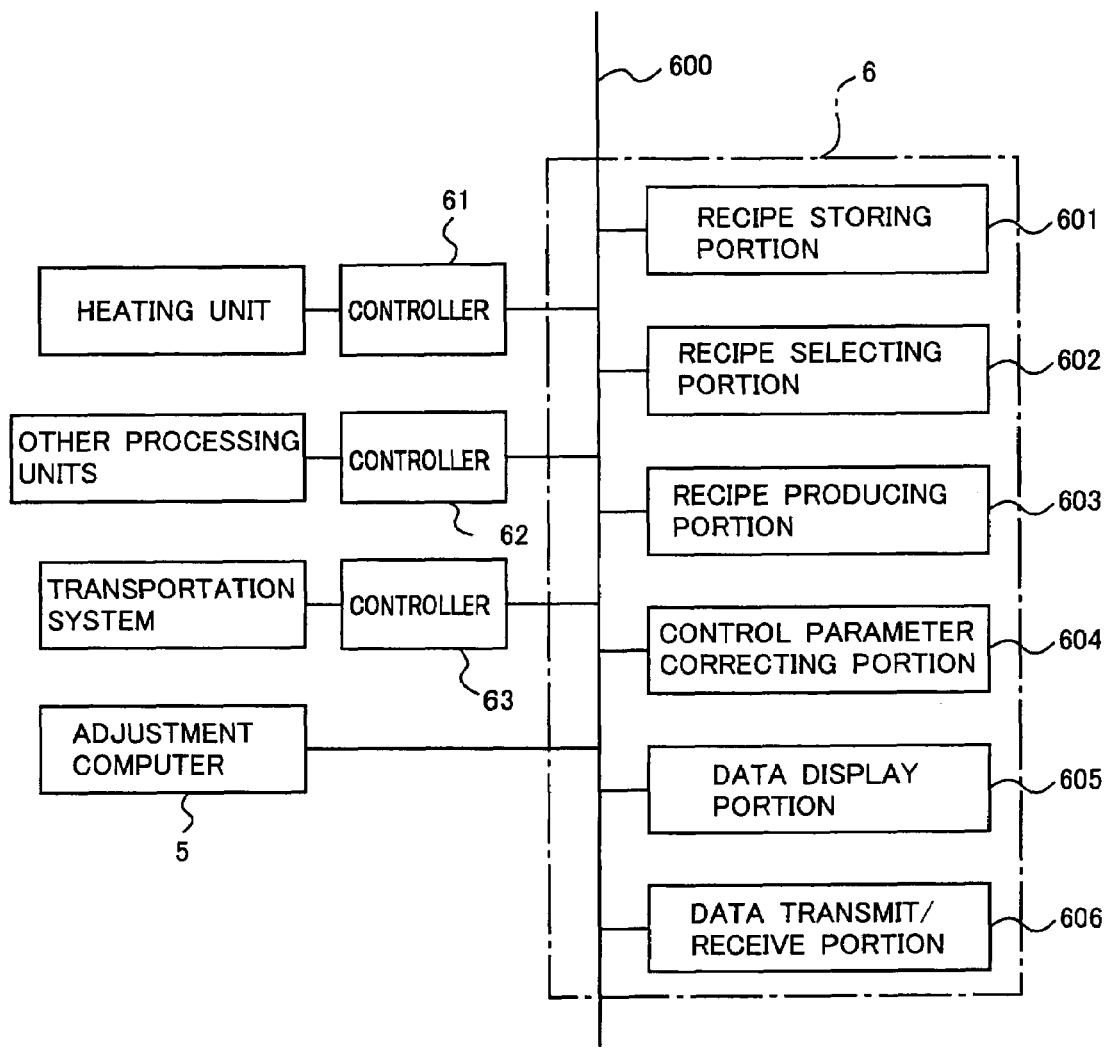
FIG. 9 shows a structure of a control portion 6.

FIG. 9 shows a structure of control portion 6. Control portion 6 is formed of a CPU, a program and a memory, but some of such components take block forms in the following description.

Referring to FIG. 9, control portion 6 includes a bus 600, a recipe storing portion 601, a recipe selecting portion 602, a recipe producing portion 603, a control parameter correcting portion 604, a data display portion 605 and a data transmit/receive portion 606, which are connected to bus 600. Recipe storing portion 601 had stored a plurality of recipes such as a temperature measuring recipe for use in the temperature measuring mode for measuring the temperature of heating plate 34 and a process recipe that is used in the processing mode for performing resist pattern forming processing on product wafer W and bears transportation paths, processing conditions in the respective processing units and the like.

The temperature measuring recipe is selected when starting the device or periodically measuring the temperature of heating plate 34, and is used for measuring the temperature of heating plate 34 when the respective heating units perform the ordinary heat treatment process after wireless wafer Ww is transported only to the heating units.

For example, the temperature measuring recipe describes the events together with times (hours). Mores specifically, it described data such as the transportation order of the heating units, the time lengths of the heat treatment performed in the heating units and the transporting times on the time axis. Thereby, transfer arm A1 and main transporting mechanisms A2 and A3 transport wireless wafer Ww to the heating units through the predetermined transportation paths according to the predetermined time.

Recipe selecting portion 602 selects appropriate one from among those stored in recipe storing portion 601. More specifically, an operator operating an operating portion (operation screen: not shown) selects the appropriate recipe such as the temperature measuring recipe or the process recipe, and thereby recipe selecting portion 602 selects the appropriate recipe from among those stored in recipe storing portion 601. In this manner, the mode can be switched between the temperature measuring mode and the processing mode. The operator can enter the number of the wafers to be processed and the type of the resist through the operation portion. Recipe producing portion 603 produces new recipes such as new temperature measuring recipes, process recipes and transportation recipes according to the operator's operation.

Control parameter correcting portion 604 corrects the control parameters of heaters H1-H3 in heating plate 34 based on the offset values transmitted from adjustment computer 5 so that heating plate 34 of each heating unit may be within predetermined specifications, and provides the corrected control parameters to a controller 61 of each heating unit. For this heating plate 34, the temperature control is performed by a combination of a PID (Proportional Integral Derivative) control that performs an arithmetic operation based on a deviation of the detected temperature value and the target temperature value to obtain signals corresponding to the quantities of the powers supplied to respective heaters H1-H3 and MV (Manipulated Value) control for supplying powers to heaters H1-H3 in a fixed output pattern, using a timer. Therefore, control parameter correcting portion 604 adjusts the input patterns of the PID control and MV control according to a predetermined algorithm based on the offset values transmitted from adjustment computer 5.

Data display portion 605 displays the produced data such as temperature data, summary data and offset values of heating plate 34, e.g., on the operation screen of the computer, i.e., control portion 6. Data transmit/receive portion 606 performs transmission/reception of predetermined data to/from adjustment computer 5. Thereby, as already described, control portion 6 can transmits and receives the data by radio or cable with respect to adjustment computer 5 of wireless wafer carrier Cw arranged outside the device, and the signal for starting and ending the temperature measurement of wireless wafer Ww, the offset values and the like can be transmitted and received to/from adjustment computer 5.

Control portion 6 is connected via controllers 61-63 to the various heating units (PAB, PEB, POST and BAKE), the various processing units other than the heating units (PAB, PEB, POST and BAKE) such as application units (COT), developing units (DEV) and temperature control units (CPL) arranged in shelf units U1-U5 of processing portion B2, and the transportation systems such as transfer arm A1, main transporting mechanisms A2 and A3, and second transporting portions A4 and A5. The operations of the various processing units are controlled by controllers 61-63 based on the instructions of control portion 6.

Taking the case of measuring the temperature of heating plate 34 of heating unit (PAB) as an example, description will now be given on the operation of the substrate processing device according to the first embodiment of the invention.

Figure 10:
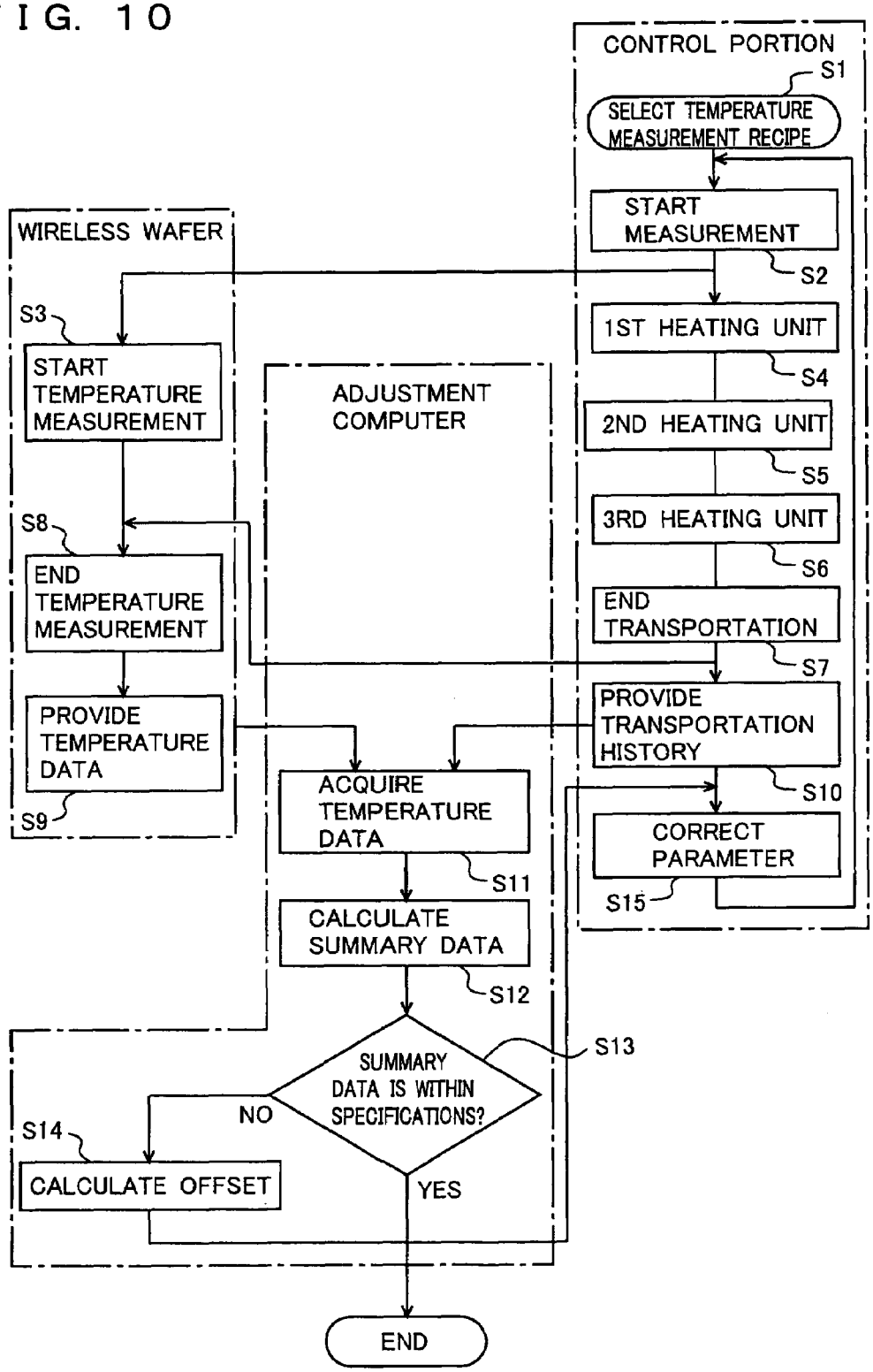
FIG. 10 is a flowchart defining operations steps for measuring a temperature of heating plate 34 by substrate processing device 100 according to the first embodiment of the invention.

FIG. 10 is a flowchart defining operation steps for measuring the temperature of heating plate 34 by substrate processing device 100 according to the first embodiment of the invention. Adjustment computer 5, control portion 6, wireless wafer carrier Cw and wireless wafer Ww read the program providing the various steps in the flowchart from a memory (not shown) or the like, and execute it. The program can be externally installed.

Referring to FIG. 10, the operator selects the temperature measuring recipe of the heating unit (step S1). When this recipe is selected, a summary of the temperature measuring recipe and a temperature measurement start switch are displayed, e.g., on the operation screen of control portion 6. When an operator touches this switch, control portion 6 provides the temperature measurement start signal to controller 45 of wireless wafer carrier Cw via adjustment computer 5 (step S2). Controller 45 provides the temperature measurement start instruction to controller 42 of wireless wafer Ww. Controller 42 receives the temperature measurement start signal, starts the temperature measurement by temperature sensor 41 at predetermined intervals, e.g., of one second and stores the time-series data of the detected temperature value thus obtained in the storing portion (step S3).

In this example, the step of providing the temperature measurement start instruction to controller 42 of wireless wafer Ww is executed inside wireless wafer carrier Cw. Therefore, the predetermined position on the predetermined transportation path corresponds to the position in wireless wafer carrier Cw.

In substrate processing device 100, wireless wafer Ww is taken out by transfer arm A1 from wireless wafer carrier Cw based on the temperature measurement start signal, and is transported to the heating unit (first heating unit performing the PAB processing in this example) to be handled as the temperature data measurement target according to the predetermined transportation path and the predetermined time (step S4).

In the first heating unit, when elevator pins 39b lowers after wireless wafer Ww is placed on heating plate 34 as already described, the sensor senses wireless wafer Ww to start the heat treatment. After the processing is performed for a predetermined time, wafer Ww is transferred to cooling plate 33 to start the cooling processing, and wireless wafer Ww will be transferred from the first heating unit after a predetermined time elapses. The timing of start of the cooling processing depends on the time at which the sensor detects the reception of wafer W by cooling plate 33.

Then, wafer Ww transferred from the first heating unit is transported by main transporting mechanisms A2 and A3 to the second heating unit performing the temperature measurement, and wireless wafer Ww performs the temperature measurement similarly to the first heating unit (step S5). Then, wireless wafer Ww is transported to the third heating unit performing the next temperature measurement, and is subjected to the similar temperature measurement (step S6).

According to the transportation path and the time thus determined, wireless wafer Ww is transported to all the heating units handled as the temperature data measurement targets, and the temperature data is measured. Then, main transporting mechanisms A2 and A3 as well as transfer arm A1 return wireless wafer Ww to wireless wafer carrier Cw. When wireless wafer Ww returns to wireless wafer carrier Cw, e.g., in the above manner, control portion 6 provides the instruction for ending the measurement to controller 42 of wireless wafer Ww via adjustment computer 5 and controller 45, and wireless wafer Ww ends the measurement of the temperature data (steps S7 and S8). For example, the battery is charged in wireless wafer Ww.

Then, adjustment computer 5 reads the time-series data of the detected temperature value stored in storing portion of wireless wafer Ww via controller 45, and stores the data in temperature data storing portion 501 (step S9). Control portion 6 operates so that the transportation history described in the temperature measurement recipe and is formed of the predetermined transportation path and time is provided from data transmit/receive portion 606 to adjustment computer 5 (step S10). Temperature data obtaining portion 502 of adjustment computer 5 takes out the time-series data of the detected temperature value obtained after the placement of wireless wafer Ww on heating plate 34 based on the transportation time from the provision of the temperature measurement start instruction to the placement of wireless wafer Ww on heating plate 34 as well as the time-series data of the detected temperature value that is stored via the storing portion of wireless wafer Ww in temperature data storing portion 501 (step S11).

Figure 11:
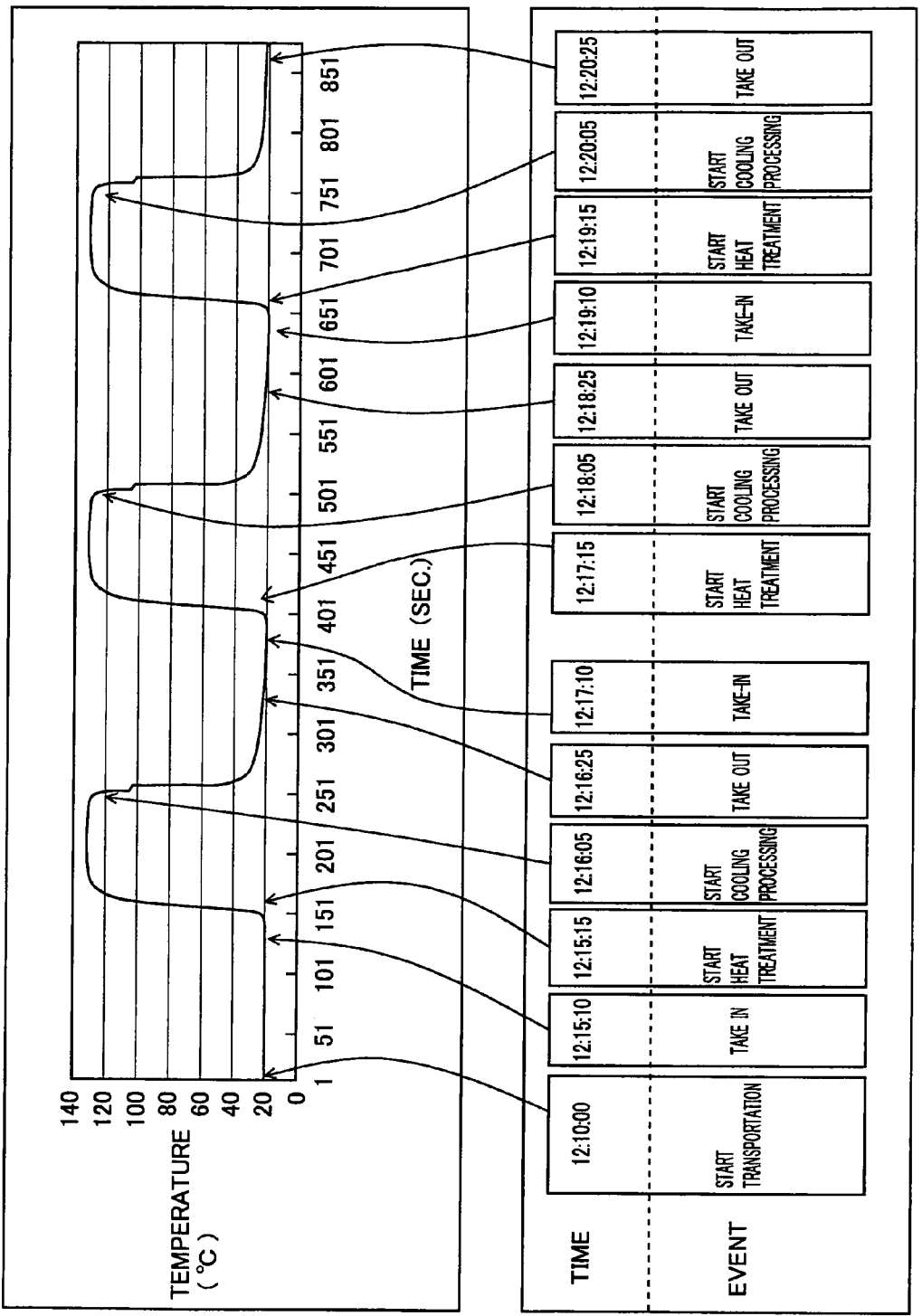
FIG. 11 is a characteristic diagram illustrating time-series data of detected temperature value of the heating plate.

FIG. 11 is a characteristic diagram illustrating the time-series data of the detected temperature value of the heating plate.

Referring to FIG. 11, the time-series data of the detected temperature value of the heating plate includes the temperature data of heating plate 34 as well as the transportation history indicating the transportation times and events.

Based on the temperature data of heating plate 34, summary data calculating portion 503 calculates summary data, i.e., the average value and range of the in-plane temperature of the heating plate (step S12). Offset calculating portion 504 compares the average value and range of the in-plane temperature of the heating plate with the target temperature range and the target in-plane temperature difference (step S13), and the temperature measuring recipe of the heating unit will end when the average value and the range of the in-plane temperature of the heating plate are within the specifications. When the average value and the range of the in-plane temperature of the heating plate are within the specifications, this means that these value and range are within the target temperature range and the target in-plane temperature difference. The target temperature range is defined, e.g., by (target temperature ±0.1° C.), and the target in-plane temperature difference is equal to or lower than 0.2° C.

When the average value and the range of the in-plane temperature of the heating plate is out of the specifications, offset calculating portion 504 calculates the offset value, and provides it to control portion 6 (step S14). In control portion 6, control parameter correcting portion 604 corrects the control parameters of heaters H1-H3 in the heating unit based on the offset value, and provides correction values of the control parameters to controller 61 of the heating unit. The heating unit performs subsequent processing with the corrected control parameters.

Control portion 6 selects the recipe for restarting the measurement of the temperature of heating unit (PAB) thus corrected, and provides the temperature measurement start instruction to execute the temperature measurement recipe. Control portion 6 automatically repeats the temperature sensing with wireless wafer Ww, the acquisition of the temperature data of heating plate 34, the calculation of the summary data and the calculation of the offset value until the average value and the range of the in-plane temperature of the heating plate based on the detected temperature value fall within the target temperature range and the target in-plane temperature difference. For example, in the second and subsequent operations, the temperature measurement recipe is configured to transport wireless wafer Ww only to the corrected heating unit.

In the substrate processing device according to the first embodiment of the invention, as described above, the temperature of heating plate 34 is measured with wireless wafer Ww provided with temperature detecting portion 41, the storing portion and controller 42. Therefore, the temperature characteristics of heating plate 34 in the heating unit handled as the target for the temperature data measurement can be performed by automatically transporting wireless wafer Ww to the heating unit handled as the temperature data measurement target by transfer arm A1 and main transporting mechanisms A2 and A3. Therefore, as compared with the case where the temperature characteristics of heating plate 34 are measured with a measurement wafer, i.e., wafer for measurement of the type in which a temperature sensor is connected to a measuring device arranged outside the measurement wafer by a serial cable, the measurement wafer can be placed on the heating plate more readily, and thus the measurement wafer can be handled more easily. Also, a time for waiting for the stabled state of the temperature inside the heating unit is not required so that lowering of the operation efficiency due to the measuring operation can be suppressed.

In the above operation, since control portion 6 operates to transfer wireless wafer Ww to the heating unit through the predetermined transportation path in substrate processing device 100, the position of wireless wafer Ww in the substrate processing device 100 can be accurately obtained according to the time. Therefore, it is possible to recognize accurately the timing according to which wireless wafer Ww is placed on heating plate 34 of the predetermined heating unit as well as the timing according to which wireless wafer Ww is transferred from heating plate 34 to the cooling plate.

Controller 42 in wireless wafer Ww receives the temperature measurement start instruction when wireless wafer Ww is located in the predetermined position on the transportation path, i.e., in the position within wireless wafer carrier Cw placed on carrier take-in portion B1. Therefore, it is possible to determine accurately the transportation time that is required for transporting wireless wafer Ww from the position within wireless wafer carrier Cw to the position on heating plate 34 of the heating unit of the measurement target.

Therefore, from the transportation time of wireless wafer Ww that is determined at the end of the temperature measurement by wireless wafer Ww and the time-series data of the detected temperature value stored in the storing portion of wireless wafer Ww, it is possible to determine accurately the temperature of wireless wafer Ww measured according to the timing of placement of wireless wafer Ww on heating plate 34 in the heating unit, the timing of transfer of wireless wafer Ww and the other timing, and the time-series data of the detected temperature value obtained after the placement on heating plate 34 can be readily and accurately taken out.

In the above operation, the temperature data can be specified at the points in time of operations in the process of each heating unit such as the placement of wireless wafer Ww on heating plate 34 performed by the lowering the elevator pins and the placement of wireless wafer Ww on the cooling plate. Therefore, it is possible to determine accurately the temperature data of each of the operation periods based on the time-series data of the detected temperature value, and more accurate analysis can be performed.

Since the time-series data of the detected temperature value of heating plate 34 can be obtained accurately, it is possible to acquire accurately the temperature data during a period from the start of the process to a designated time as well as the temperature data for each zone, and the average value and the range of the in-plane temperature of the heating plate can be accurately determined. Accordingly, the accurate offset value can be calculated. Since the control parameter of heating plate 34 is corrected based on the calculated offset value, adjustment can be performed to uniformize the temperature rising patterns of the respective zones in each heating plate 34. Thereby, the in-plane temperature distributions of the respective zones during the temperature rising can be uniformized, and the heat treatment with high in-plane uniformity can be performed.

Since the accurate temperature curve can be produced for each heating plate 34, a comparison in temperature data and film quality data of, e.g., the developing line width and film thickness can be easily performed between the heating units performing the same processing. The control parameter of controller 61 of each heating unit is corrected so that a thin film of a predetermined film quality can be obtained based on the comparison result. Thereby, the uniformity in heat treatment of the respective heating units can be improved.

The time-series data of the detected temperature value of each heating plate 34 can be accurately acquired. Therefore, even when the temperature measurement of wireless wafer Ww is performed at the intervals of one second, interpolation in an ordinary interpolation method can be performed for the measurement interval so that, for example, the accurate integration value (area) can be calculated, and the accurate two-dimensional processed data can be acquired.

In the substrate processing device according to the first embodiment of the invention, the wireless wafer is laid on heating plate 34 of each of the heating units (PAB and PEB) for a predetermined time, and then wireless wafer Ww is laid on the cooling plate to attain a steady temperature, e.g., of 24° C. so that the first temperature measurement data is obtained. Then, wireless wafer Ww is laid on heating plate 34 for a predetermined time again, and subsequently wireless wafer Ww is laid on the cooling plate for a predetermined time to attain the steady temperature so that the second temperature measurement data is obtained. By repeating the above operations multiple time, the temperature data of heating plate 34 may be acquired multiple times, and the summary data and the offset value may be calculated from the plurality of data items thus obtained to determine the average value thereof. In this case, the temperature of the heating plate can be measured multiple times while transferring wireless wafer Ww to the heating unit of the measurement target only one time.

In the substrate processing device according to the first embodiment of the invention, control portion 6 may calculate the time-series data of the detected temperature value of heating plate 34 as well as the summary data thereof and the offset value. In this case, adjustment computer 5 provides the instruction indicating the start and end of the temperature measurement to controller 45 based on the instructions provided by control portion 6 for starting and ending of the measurement. Also, adjustment computer 5 transmits the time-series data of the detected temperature value read from the storing portion of wireless wafer Ww to control portion 6, and further performs other operations. Adjustment computer 5 may perform the control parameter correction of controller 61 of the heating unit based on the offset value.

In the substrate processing device according to the first embodiment of the invention, the heat treatment performed on the wafer includes the heat treatment at a positive temperature for heating the wafer, and the heat treatment at a negative temperature for cooling the wafer. Thereby, the substrate processing device according to the first embodiment of the invention can also be applied to the case of measuring the temperature characteristics of heating plate 34 included in the heating unit that performs the bake processing and post-baking processing as well as temperature characteristics of the temperature control plate of the temperature control unit effecting temperature control processing at a predetermined temperature on the wafer.

In the substrate processing device according to the first embodiment of the invention, when the substrate is taken out from wireless wafer carrier Cw, controller 45 of carrier Cw may provide the temperature measurement start instruction to controller 42 of wireless wafer Ww. When the substrate returns to wireless wafer carrier Cw and controller 45 of wireless wafer carrier Cw recognizes the presence of wireless wafer Ww, an instruction for ending the measurement may be provided to controller 42 of wireless wafer Ww to end the measurement of the temperature data by wireless wafer Ww.

In the substrate processing device according to the first embodiment of the invention, the predetermined position on the transportation path where the temperature measurement start instruction is provided to controller 42 of wireless wafer Ww is the same as the start point for the temperature detection by wireless wafer Ww, and is also the same as the start point for the time of transportation of wireless wafer Ww to heating plate 34. This structure is not restrictive, and the predetermined position for providing the temperature measurement start instruction may be different from the position within wireless wafer carrier Cw placed on carrier take-in portion B1 provided that the position allows provision of the temperature measurement start instruction to controller 42 before the transportation of wireless wafer Ww to heating plate 34. For example, the position may be within a buffer cassette arranged in carrier take-in portion B1 or processing portion B2.

In the substrate processing device according to the first embodiment of the invention, control portion 6 provides the measurement end instruction to controller 42 of wireless wafer Ww via adjustment computer 5 and controller 45 when wireless wafer Ww returns into wireless wafer carrier Cw after the temperature data of all the heating units of the temperature data measurement targets is measured. However, this structure is not restrictive. Control portion 6 may directly provide the measurement end instruction to controller 42 of wireless wafer Ww and thereby may end the measurement of the temperature data by wireless wafer Ww during returning toward wireless wafer carrier Cw after wireless wafer Ww performed the measurement the temperature data of all the heating units of the temperature data measurement targets.

Even in this case, wireless wafer Ww is transported to the heating unit through the predetermined transportation path, and the temperature measurement start instruction is provided to controller 42 of wireless wafer Ww in the predetermined position on the predetermined transportation path. Therefore, the time-series data of the detected temperature value obtained after the placement of wireless wafer Ww on heating plate 34 can be taken out based on the transportation time from the provision of the temperature measurement start instruction to the placement of wireless wafer Ww on heating plate 34 as well as the time-series data of the detected temperature value stored in the storing portion of wireless wafer Ww.

Other embodiments of the invention will now be described with reference to the drawings. In the figure, the same or corresponding portions bear the same reference numbers, and description thereof is not repeated.

SECOND EMBODIMENT

A second embodiment relates to a substrate processing device in which the temperature rising patterns of the respective zones in each heating plate are uniformized by a modified adjusting manner. The structures and operations other than those described below are the same as those of the substrate processing device according to the first embodiment of the invention.

For example, in the case where heating plate 34 is concentrically provided with the plurality of (e.g., three) heaters H1-H3 as shown in FIG. 5, the correspondence between the divided regions (zones), i.e., the heating-undertaking regions of each of heaters H1-H3 and the temperature sensors is determined in advance, and thereby the in-plane temperature of heating plate 34 can be adjusted. More specifically, assuming that heaters H1-H3 heat respective zones 1-3 in a controlled manner, the average value of the detected temperature value of each of zones 1-3 can be determined, and therefore differences (ranges) between the average values of the detected temperature values of the respective zones 1-3 can be determined. Therefore, it is possible to adjust quantities of the powers supplied to respective heaters H1-H3 based on the average values and ranges.

Figure 12A:
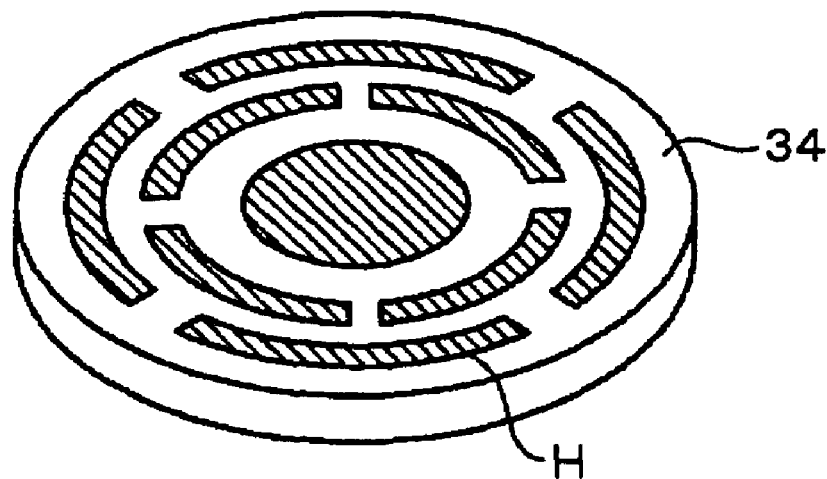
FIG. 12A is a schematic perspective view showing an example of a heating plate in a second embodiment of the invention.
Figure 12B:
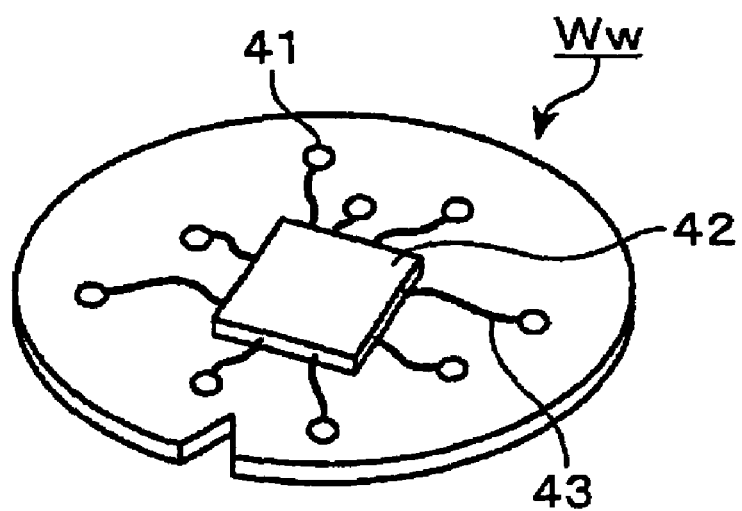
FIG. 12B is a schematic perspective view showing an example of a wireless wafer Ww in the second embodiment of the invention.

FIG. 12A is a schematic perspective view showing an example of the heating plate in the second embodiment of the invention. FIG. 12B is a schematic perspective view showing an example of wireless wafer Ww in the second embodiment of the invention.

Referring to FIGS. 12A and 12B, heaters H arranged in heating plate 34 are divided also in the circumferential direction. In this case, consideration must be given to the direction or orientation of the wireless wafer Ww placed on heating plate 34 for establishing the correspondence between respective temperature sensors 41 and the zones heated in a controlled manner by heaters H.

For easy understanding of the manner in which the temperature data of each zone is determined in the above case, the following description will be given in connection with a further simplified case.

Figure 13A:
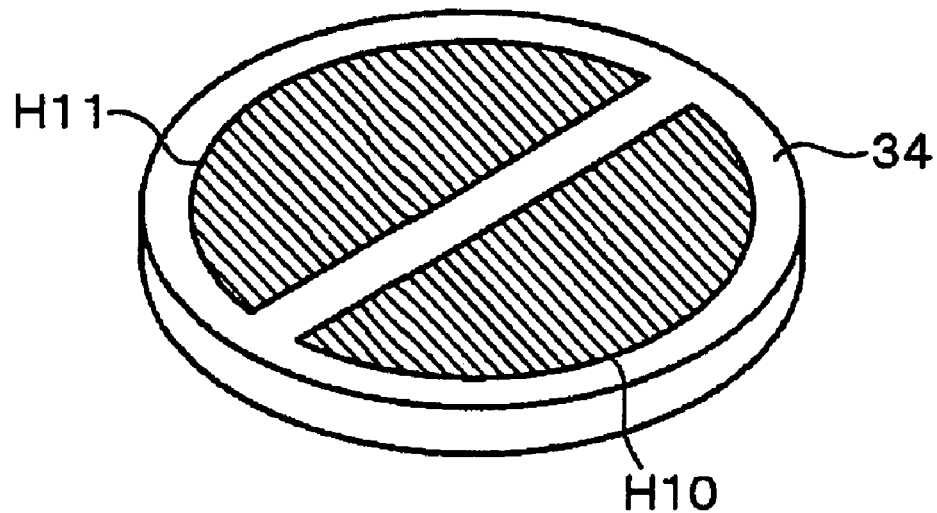
FIG. 13A is a schematic perspective view showing an example of a heating plate in the second embodiment of the invention.
Figure 13B:
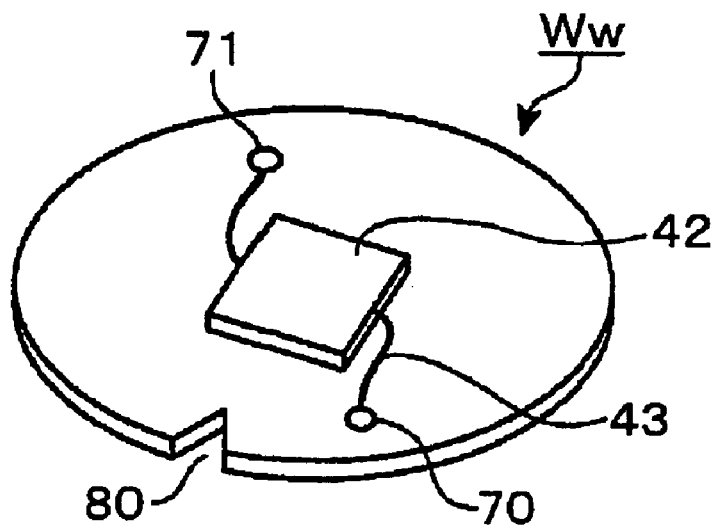
FIG. 13B is a schematic perspective view showing an example of wireless wafer Ww in the second embodiment of the invention.

FIG. 13A is a schematic perspective view showing an example of the heating plate in the second embodiment of the invention. FIG. 13B is a schematic perspective view showing an example of wireless wafer Ww in the second embodiment of the invention.

Referring to FIGS. 13A and 13B, wireless wafer Ww is provided with two temperature sensors 70 and 71 corresponding to two heaters H10 and H11, respectively, which take circumferentially divided forms on heating plate 34.

As shown in FIG. 13B, wireless wafer Ww is provided at a portion of its periphery with a V-shaped recess or notch 80 for indicating a plane direction. First and second temperature sensors 70 and 71 are diagonally opposed to each other with temperature controller 42 therebetween.

Figure 14:
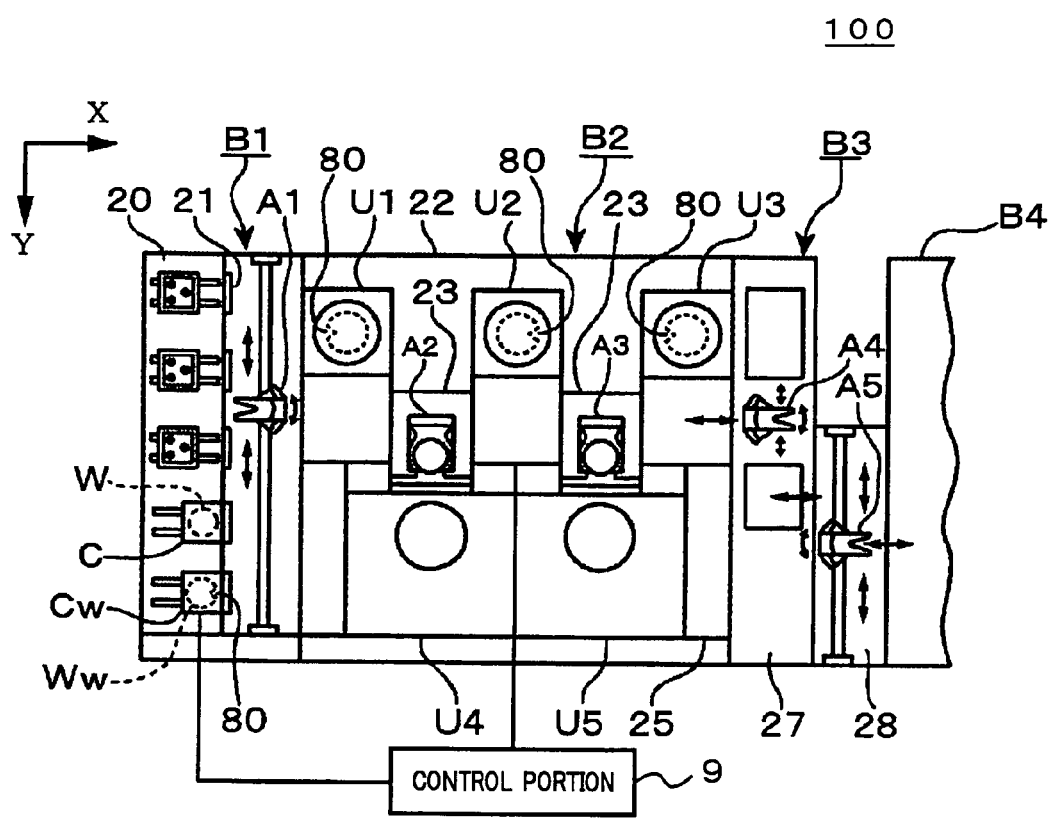
FIG. 14 is a plan of a substrate processing device 100 according to the second embodiment of the invention.

FIG. 14 is a plan of substrate processing device 100 according to the second embodiment of the invention.

Substrate processing device 100 according to the second embodiment of the invention includes a control portion 9 instead of adjustment computer 5 and control portion 6 in substrate processing device 100 according to the first embodiment of the invention.

Figure 15:
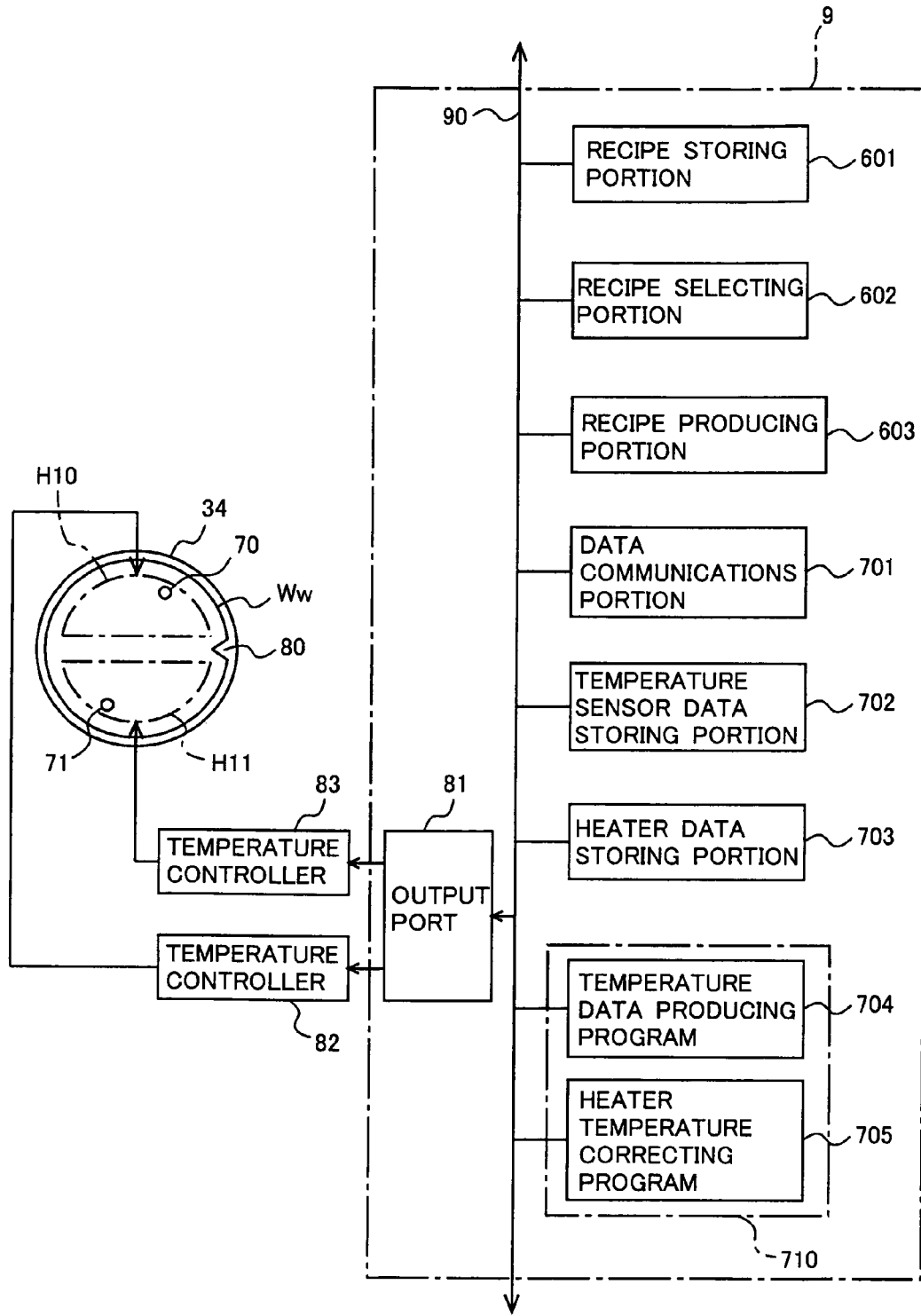
FIG. 15 illustrates a structure of a control portion 9.

FIG. 15 illustrates a structure of control portion 9. Control portion 9 is practically formed of a CPU, a program, a memory and the like, but FIG. 15 illustrates some of components in block forms.

Referring to FIG. 15, control portion 9 includes a bus 90, recipe storing portion 601, recipe selecting portion 602, recipe producing portion 603, a data communications portion 701, a temperature sensor data storing portion 702, a heater data storing portion 703 and a program storing portion 710, which are connected to bus 90. Recipe storing portion 601, recipe selecting portion 602 and recipe producing portion 603 are the same as those in the substrate processing portion of the first embodiment of the invention, and therefore description thereof is not repeated.

Data communications portion 701 performs various kinds of data communications with wireless wafer Ww. Data communications portion 701 provides the temperature detection start instruction to controllers 82 and 83 via an output port 81, receives the temperature data detected by first and second temperature sensors 70 and 71 and performs other operations.

Temperature sensor data storing portion 702 stores the temperature data detected by first and second temperature sensors 70 and 71 in each heating unit.

Heater data storing portion 703 executes the temperature data producing program to be described later based on the temperature data stored in temperature sensor data storing portion 702, and stores the temperature data in a fashion correlated with the heaters in the respective heating units, i.e., the divided regions (heating control regions) assigned to the heaters.

Program storing portion 710 stores a temperature data producing program 704 and a heater temperature correcting program 705. Heater temperature correcting program 705 has a function of providing correction values of the control parameters to temperature controllers 82 and 83 related to the respective heaters based on the temperature data that is stored in heater data storing portion 703 in connection with the respective divided regions of heating plate 34 as well as the temperature measurement data that is set in advance.

Temperature data producing program 704 and heater temperature correcting program 705 are stored in a record medium such as a flexible disk, a compact disk, a Magneto-Optical (MO) disk or a memory card. Temperature data producing program 704 and heater temperature correcting program 705 are installed in a computer forming control portion 9, and are stored in program storing portion 710.

Referring to FIG. 15, description will now be given on the manner of the temperature correction on the divided regions in each heating unit. As already described with reference to FIG. 10, when the operator touches the transportation start switch, transfer arm A1 takes out wireless wafer Ww from wireless wafer carrier Cw, and transfers it to the first heating unit kept in shelf unit U1 (step S4 in FIG. 10).

Figure 16:
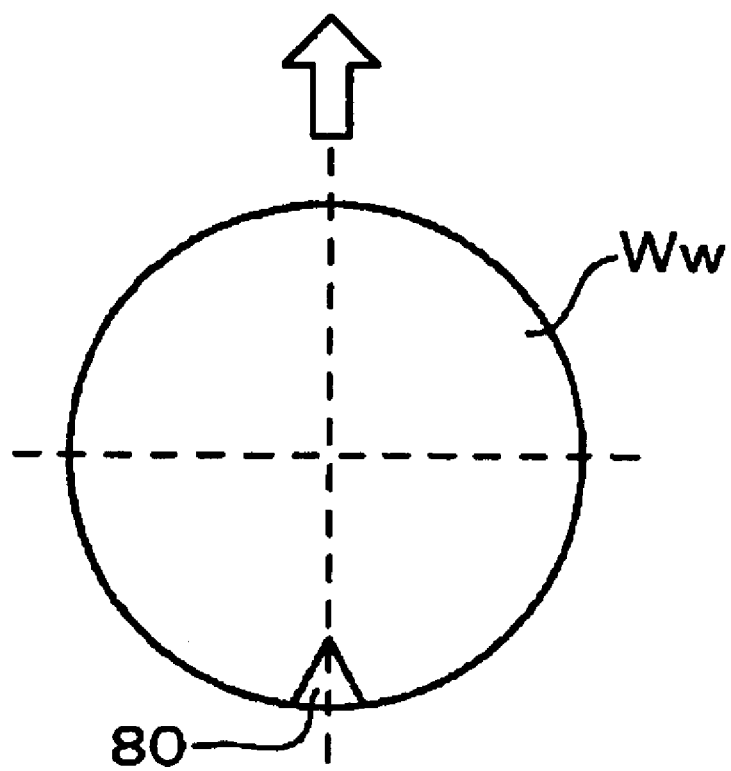
FIG. 16 shows a take-in angle of wireless wafer Ww taken into a heating unit.

FIG. 16 illustrates a take-in angle of wireless wafer Ww transferred to the heating unit. Referring to FIG. 16, it is defined that the take-in angle is 0 degrees when notch 80 of wireless wafer Ww is oriented in the transferring direction to the heating unit. In this case, the take-in angle of wireless wafer Ww transferred to the first heating unit is 90 degrees. The first heating unit is configured such that a cooling plate slides between a position on heating plate 34 and a position where transfer arm A1 or main transporting mechanism A2 accesses wireless wafer Ww, and therefore notch 80 is oriented as shown in FIG. 16. In the first heating unit, wireless wafer Ww is placed on heating plate 34 for the heat processing, as already described.

Wireless wafer Ww transferred from the first heating unit is transported by main transporting mechanism A2 to the second heating unit kept in shelf unit U2, and is subjected to similar processing (step S5 in FIG. 10). Further, wireless wafer Ww is transported by main transporting mechanism A3 to the third heating unit kept in shelf unit U3, and is subjected to similar processing (step S6 in FIG. 10). In this example, it is assumed that wireless wafer Ww is transferred into the second and third heating units at the take-in angles of 270 degrees and 90 degrees, respectively.

Figures 17, 18:
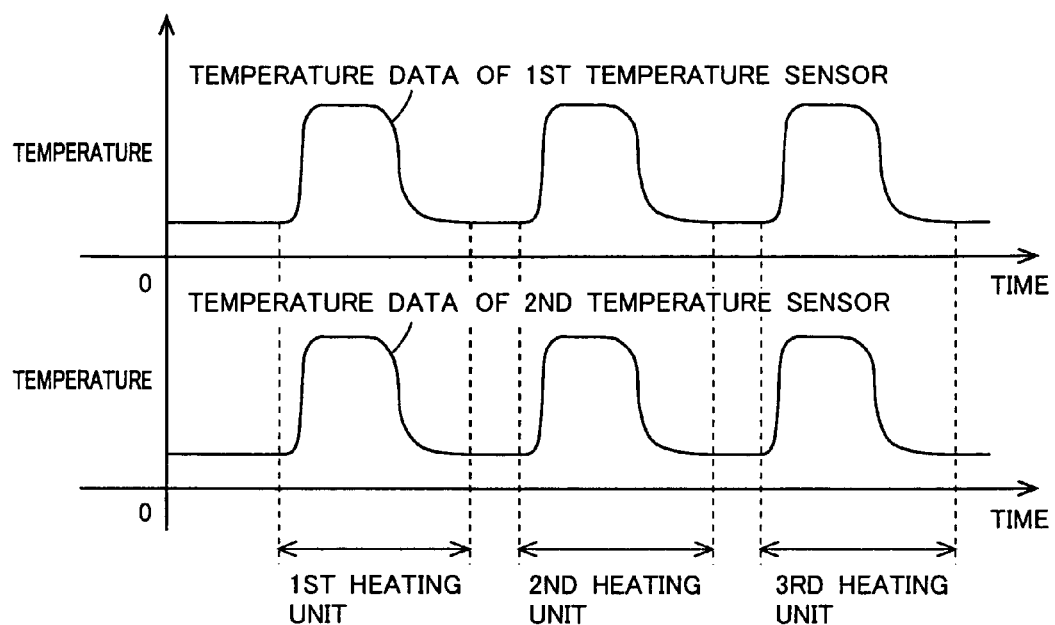
FIG. 17 is a characteristic diagram illustrating time-series data of the detected temperature values of the heating plate obtained by various temperature sensors.
FIG. 18 illustrates a table providing the take-in angle of a wireless wafer Ww taken into each heating unit and a heater position of each temperature sensor.

FIG. 17 is a characteristic diagram illustrating the time-series data of the detected temperature values of the heating plate obtained by the respective temperature sensors.

As already described, wireless wafer Ww is transported to all the heating units (i.e., the first, second and third heating units in this example) according to the predetermined transportation path and time. Thereby, as illustrated in FIG. 17, each heating unit can operate to acquire the temperature data of the heating region assigned to first temperature sensor 70 and the temperature data of the heating region assigned to the second temperature sensor 71.

FIG. 18 illustrates a table providing the take-in angle of wireless wafer Ww transferred into each heating unit and the heater position of each temperature sensor.

Using the table, temperature data producing program 704 is executed to determine the correspondence between the heater heating control regions of each heating plate 34 and the temperature data of the temperature sensors, giving consideration to the take-in angle of wireless wafer Ww with respect to heating plate of each heating unit as illustrated in FIG. 18. Thus, the temperature of the divided region of each heating plate 34 can be obtained based on the take-in angle of wireless wafer Ww and the temperature data of the first and second temperature sensors 70 and 71.

Figure 19:
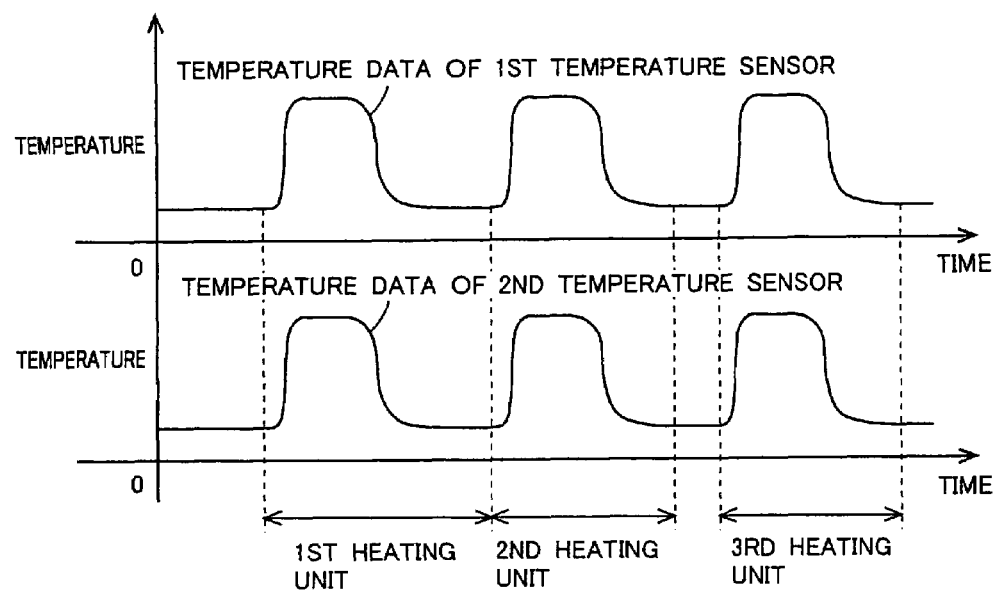
FIG. 19 is a characteristic diagram illustrating time-series data of the detected temperature value of each heater.
Figure 20:
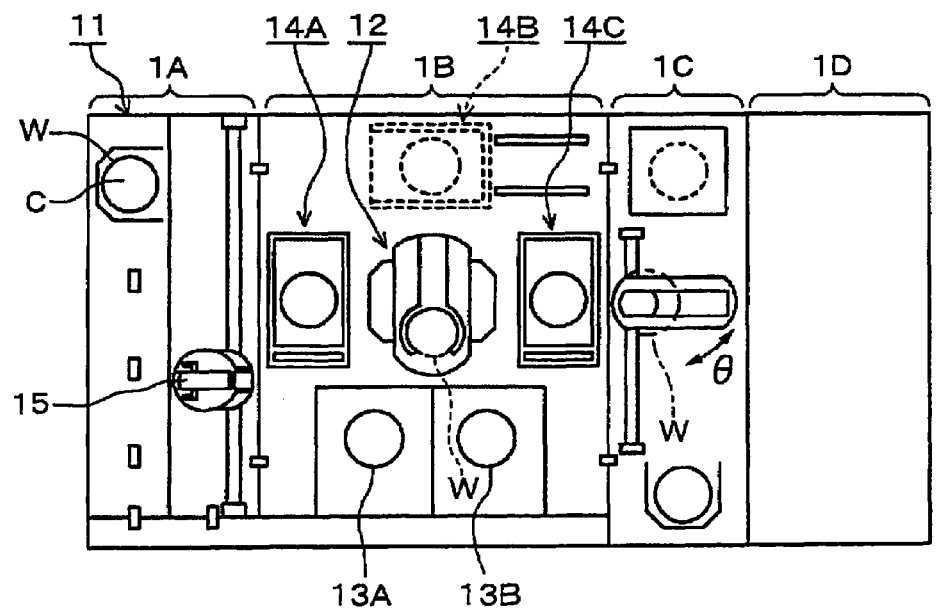
FIG. 20 is a plan showing an example of a conventional resist pattern forming device.
Figure 22A:
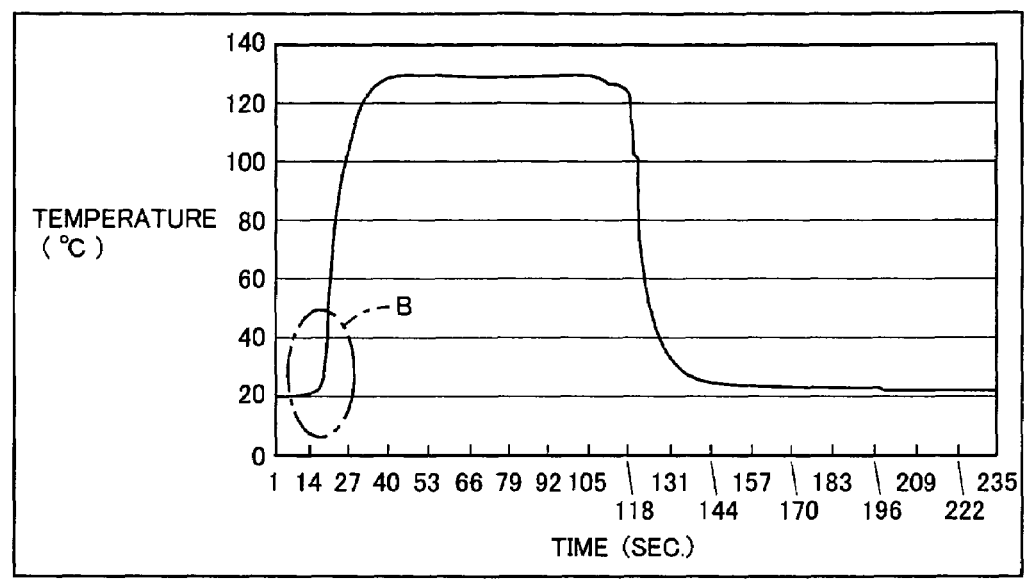
FIG. 22A is a characteristic diagram illustrating an example of a temperature rising pattern of the heating plate.
Figure 22B:
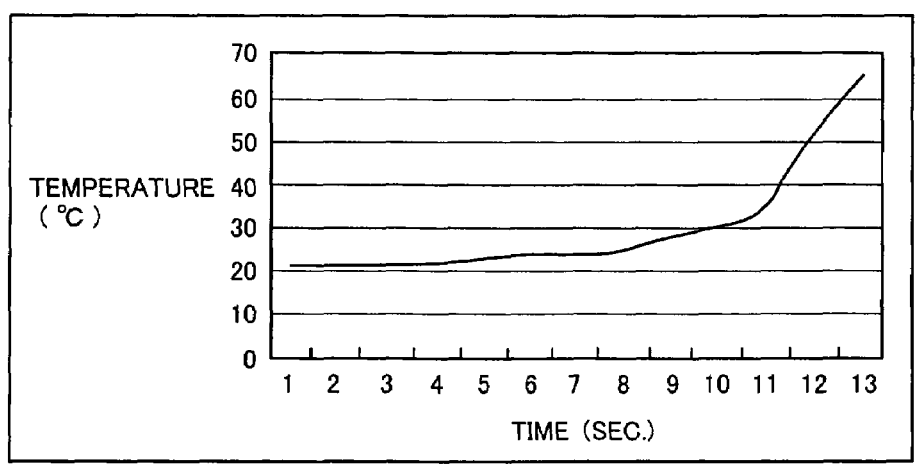
FIG. 22B shows on an enlarged scale a portion indicated by B in FIG. 22A.

FIG. 19 is a characteristic diagram illustrating the time-series data of the detected temperature value of each heater.

Referring to FIG. 19, the temperature data for each of the heating control regions (divided regions) assigned to each heater can be obtained in connection with first and second temperature sensors 70 and 71 as well as the respective heating units. Temperature data producing program 704 has the function of adjusting, according to a predetermined algorithm, the input patterns of the PID control and MV control that are the power supply control data for each heater similarly to the control parameter correcting portion 604 based on the temperature data illustrated in FIG. 19 and predetermined temperature data (e.g., stored in a memory (not shown)). More specifically, temperature data producing program 704 is executed to adjust the target temperature value and the time constant in the PID control, to adjust the supplied power level and supply time of the power in the MV control and thereby to provide the correction values based on the adjusted contents from control portion 9 to the temperature controller relating to each heater (step S15 in FIG. 10).

Controller 9 selects the recipe for restarting the measurement of the temperature of the corrected heating unit, and provides the temperature measurement start instruction to execute the temperature measurement recipe. As described above, control portion 9 automatically repeats the temperature detection with wireless wafer Ww, acquisition of the temperature data of heating plate 34, calculation of the summary data and the calculation of the offset value until the average value and the range of the in-plane temperature of the heating plate based on the detected temperature value fall within the target temperature range and the target in-plane temperature difference.

According to the substrate processing device of the second embodiment of the invention, when wireless wafer Ww is transported to each heating unit through the predetermined transportation path, the respective heating regions assigned to first and second temperature sensors 70 and 71 formed at the surface of wireless wafer Ww are determined based on the transportation angle of wireless wafer Ww transported into the heating unit. Thus, it is possible to determine the correspondence between each temperature sensor formed at the surface of wireless wafer Ww in each heating unit and the each heater arranged in heating plate 34. Therefore, the temperature control parameter of each heater can be adjusted based on the temperature data measured by each of the temperature sensors in each heating unit.

The invention claimed is:

1. A method of measuring a heating plate temperature in a substrate processing device provided with a carrier take-in portion taking in a carrier accommodating a plurality of substrates, a processing unit including a heating unit placing said substrate on said heating plate and performing heat treatment on said substrate, and a transporting portion receiving said substrate from the carrier take-in portion and transporting said substrate to said processing unit, wherein
said method includes:
a step of transporting said temperature detection substrate including a temperature detecting portion, a storing portion and a substrate controller through a predetermined transportation path to said heating unit by said transporting portion;
a start instruction providing step of providing a temperature measurement start instruction to the substrate controller of said temperature detection substrate in a predetermined position on said transportation path;
a step of receiving said temperature measurement start instruction and storing time-series data of a detected temperature value in said storing portion by said temperature detection substrate; and
a time-series data fetching step of fetching the time-series data of said detected temperature value obtained after placement of said temperature detection substrate on said heating plate based on a transportation time from the provision of said temperature measurement start instruction to the placement of said temperature detection substrate on said heating plate and the time-series data of the detected temperature value in said storing portion.

2. The method of measuring the heating plate temperature according to claim 1, wherein
an adjustment computer takes out the time-series data of said detected temperature value after the placement of said temperature detection substrate on said heating plate in said time-series data fetching step.

3. The method of measuring the heating plate temperature according to claim 2, further comprising:
a step of correcting a control parameter of a heating portion included in said heating plate based on the time-series data of said detected temperature value obtained after the placement of said temperature detection substrate on said heating plate.

4. The method of measuring the heating plate temperature according to claim 2, wherein
said heating plate is divided into a plurality of heating regions, and is configured to heat independently each of the divided regions by corresponding one among a plurality of heating portions, and
the temperature detecting portion included in said temperature detection substrate is arranged in each of positions corresponding to the respective divided portions.

5. The method of measuring the heating plate temperature according to claim 2, wherein
said heating plate is circumferentially divided into a plurality of heating regions, and is configured to heat independently each of the divided regions by corresponding one among a plurality of heating portions,
said temperature detection substrate includes a plurality of said temperature detecting portions for detecting the temperature of each of said divided regions, and
said method of measuring the heating plate temperature further comprises a step of correcting a control parameter of each of said heating portions based on the time-series data of the detected temperature value of each of said divided regions obtained according to a direction of said temperature detection substrate at the time of placement of said temperature detection substrate on said heating plate and the time-series data of the detected temperature value of each of said temperature detecting portions.

6. The method of measuring the heating plate temperature according to claim 2, wherein
in said start instruction providing step, a carrier controller arranged at the carrier accommodating said temperature detection substrate and placed on the carrier take-in portion provides said temperature measurement start instruction, and said temperature measurement start instruction is output when said transporting portion takes out said temperature detection substrate from said carrier.

7. The method of measuring the heating plate temperature according to claim 1, further comprising:
a step of correcting a control parameter of a heating portion included in said heating plate based on the time-series data of said detected temperature value obtained after the placement of said temperature detection substrate on said heating plate.

8. The method of measuring the heating plate temperature according to claim 1, wherein
said heating plate is divided into a plurality of heating regions, and is configured to heat independently each of the divided regions by corresponding one among a plurality of heating portions, and
the temperature detecting portion included in said temperature detection substrate is arranged in each of positions corresponding to the respective divided portions.

9. The method of measuring the heating plate temperature according to claim 1, wherein
said heating plate is circumferentially divided into a plurality of heating regions, and is configured to heat independently each of the divided regions by corresponding one among a plurality of heating portions,
said temperature detection substrate includes a plurality of said temperature detecting portions for detecting the temperature of each of said divided regions, and
said method of measuring the heating plate temperature further comprises a step of correcting a control parameter of each of said heating portions based on the time-series data of the detected temperature value of each of said divided regions obtained according to a direction of said temperature detection substrate at the time of placement of said temperature detection substrate on said heating plate and the time-series data of the detected temperature value of each of said temperature detecting portions.

10. The method of measuring the heating plate temperature according to claim 1, wherein
in said start instruction providing step, a carrier controller arranged at the carrier accommodating said temperature detection substrate and placed on the carrier take-in portion provides said temperature measurement start instruction, and said temperature measurement start instruction is output when said transporting portion takes out said temperature detection substrate from said carrier.

11. A substrate processing device comprising:
a carrier take-in portion taking in a carrier accommodating a plurality of substrates;
a processing unit including a heating unit placing said substrate on said heating plate and performing heat treatment on said substrate;
a transporting portion receiving said substrate from the carrier take-in portion and transporting said substrate to said processing unit;
a control portion controlling said transporting portion to transport said temperature detection substrate including a temperature detecting portion, a storing portion and a substrate controller through a predetermined transportation path to said heating unit by said transporting portion;
a carrier controller providing a temperature measurement start instruction to the substrate controller of said temperature detection substrate in a predetermined position on said transportation path; and
an adjustment computer fetching time-series data of a detected temperature value obtained after placement of said temperature detection substrate on said heating plate based on a transportation time from the provision of said temperature measurement start instruction to the placement of said temperature detection substrate on said heating plate and the time-series data of the detected temperature value stored in said storing portion included in said temperature detection substrate in response to reception of said temperature measurement start instruction.

12. The substrate processing device according to claim 11, wherein
said control portion further corrects a control parameter of a heating portion included in said heating plate based on the time-series data of said detected temperature value obtained after the placement of said temperature detection substrate on said heating plate.

13. The substrate processing device according to claim 12, wherein
said heating plate is divided into a plurality of heating regions, and is configured to heat independently each of the divided regions by a plurality of heating portions, and
the temperature detecting portion included in said temperature detection substrate is arranged in each of positions corresponding to the respective divided portions.

14. The substrate processing device according to claim 12, wherein
said heating plate is circumferentially divided into a plurality of heating regions, and is configured to heat independently each of the divided regions by a plurality of heating portions,
said temperature detection substrate includes a plurality of said temperature detecting portions for detecting the temperature of each of said divided regions, and
said control portion further corrects a control parameter of each of said heating portions based on the time-series data of the detected temperature value of each of said divided regions obtained according to a direction of said temperature detection substrate at the time of placement of said temperature detection substrate on said heating plate and the time-series data of the detected temperature value of each of said temperature detecting portions.

15. The substrate processing device according to claim 12, wherein
said carrier controller is arranged at the carrier accommodates said temperature detection substrate and placed on the carrier take-in portion, and provides said temperature measurement start instruction when said transporting portion takes out said temperature detection substrate from said carrier.

16. The substrate processing device according to claim 11, wherein
said heating plate is divided into a plurality of heating regions, and is configured to heat independently each of the divided regions by a plurality of heating portions, and the temperature detecting portion included in said temperature detection substrate is arranged in each of positions corresponding to the respective divided portions.

17. The substrate processing device according to claim 11, wherein
said heating plate is circumferentially divided into a plurality of heating regions, and is configured to heat independently each of the divided regions by a plurality of heating portions,
said temperature detection substrate includes a plurality of said temperature detecting portions for detecting the temperature of each of said divided regions, and
said control portion further corrects a control parameter of each of said heating portions based on the time-series data of the detected temperature value of each of said divided regions obtained according to a direction of said temperature detection substrate at the time of placement of said temperature detection substrate on said heating plate and the time-series data of the detected temperature value of each of said temperature detecting portions.

18. The substrate processing device according to claim 11, wherein
said carrier controller is arranged at the carrier accommodates said temperature detection substrate and placed on the carrier take-in portion, and provides said temperature measurement start instruction when said transporting portion takes out said temperature detection substrate from said carrier.

19. A computer-readable recording medium with a computer program recorded thereon and used for measuring a heating plate temperature in a substrate processing device provided with a carrier take-in portion taking in a carrier accommodating a plurality of substrates, a processing unit including a heating unit placing said substrate on said heating plate and performing heat treatment on said substrate, and a transporting portion receiving said substrate from the carrier take-in portion and transporting said substrate to said processing unit, wherein
said program causes a computer to execute:
a step of transporting said temperature detection substrate including a temperature detecting portion, a storing portion and a substrate controller through a predetermined transportation path to said heating unit by said transporting portion;
a start instruction providing step of providing a temperature measurement start instruction to the substrate controller of said temperature detection substrate in a predetermined position on said transportation path;
a step of receiving said temperature measurement start instruction and storing time-series data of a detected temperature value in said storing portion by said temperature detection substrate; and
a time-series data fetching step of fetching the time-series data of said detected temperature value obtained after placement of said temperature detection substrate on said heating plate based on a transportation time from the provision of said temperature measurement start instruction to the placement of said temperature detection substrate on said heating plate and the time-series data of the detected temperature value in said storing portion.

20. The computer-readable recording medium with the computer program recorded thereon and used for measuring the heating plate temperature according to claim 19, wherein
an adjustment computer takes out the time-series data of said detected temperature value after the placement of said temperature detection substrate on said heating plate in said time-series data fetching step.

* * * * *